(12) United States Patent
Tadaki et al.

(10) Patent No.: US 6,674,112 B1
(45) Date of Patent: Jan. 6, 2004

(54) SEMICONDUCTOR INTEGRATED CIRCUIT DEVICE

(75) Inventors: Yoshitaka Tadaki, Hanno (JP); Yutaka Ito, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/446,509

(22) PCT Filed: Jun. 15, 1998

(86) PCT No.: PCT/JP98/02620

§ 371 (c)(1),
(2), (4) Date: Dec. 27, 1999

(87) PCT Pub. No.: WO99/00846

PCT Pub. Date: Jan. 7, 1999

(30) Foreign Application Priority Data

Jun. 27, 1997 (JP) .............................................. 9-187476

(51) Int. Cl.[7] ............................................ H01L 27/108
(52) U.S. Cl. ....................................................... 257/297
(58) Field of Search .................................. 257/296, 297, 257/300

(56) References Cited

U.S. PATENT DOCUMENTS

| | | | | |
|---|---|---|---|---|
| 5,617,369 A | * | 4/1997 | Tomishima et al. | 365/189.11 |
| 5,970,003 A | * | 10/1999 | Miyatake et al. | 365/200 |
| 6,333,873 B1 | * | 12/2001 | Kumanoya et al. | 365/189.09 |

* cited by examiner

Primary Examiner—Wael Fahmy, Jr.
Assistant Examiner—Ginette Peralta
(74) Attorney, Agent, or Firm—Antonelli, Terry, Stout & Kraus, LLP

(57) ABSTRACT

A semiconductor integrated circuit device has a semiconductor substrate and operates when supplied with appositive supply voltage and a circuit ground potential. The device has word lines, pairs of bit lines, data storage capacitors, and N-channel MOSFETs each having a gate connected to any one of the word lines and a source-drain path interposed between one of the paired bit lines on the one hand and a terminal of any one of the data storage capacitors on the other hand. A positive internal voltage higher than a circuit ground potential is generated and fed as a bias voltage to P-type regions wherein address selection MOSFETs of dynamic memory cells are formed.

27 Claims, 24 Drawing Sheets

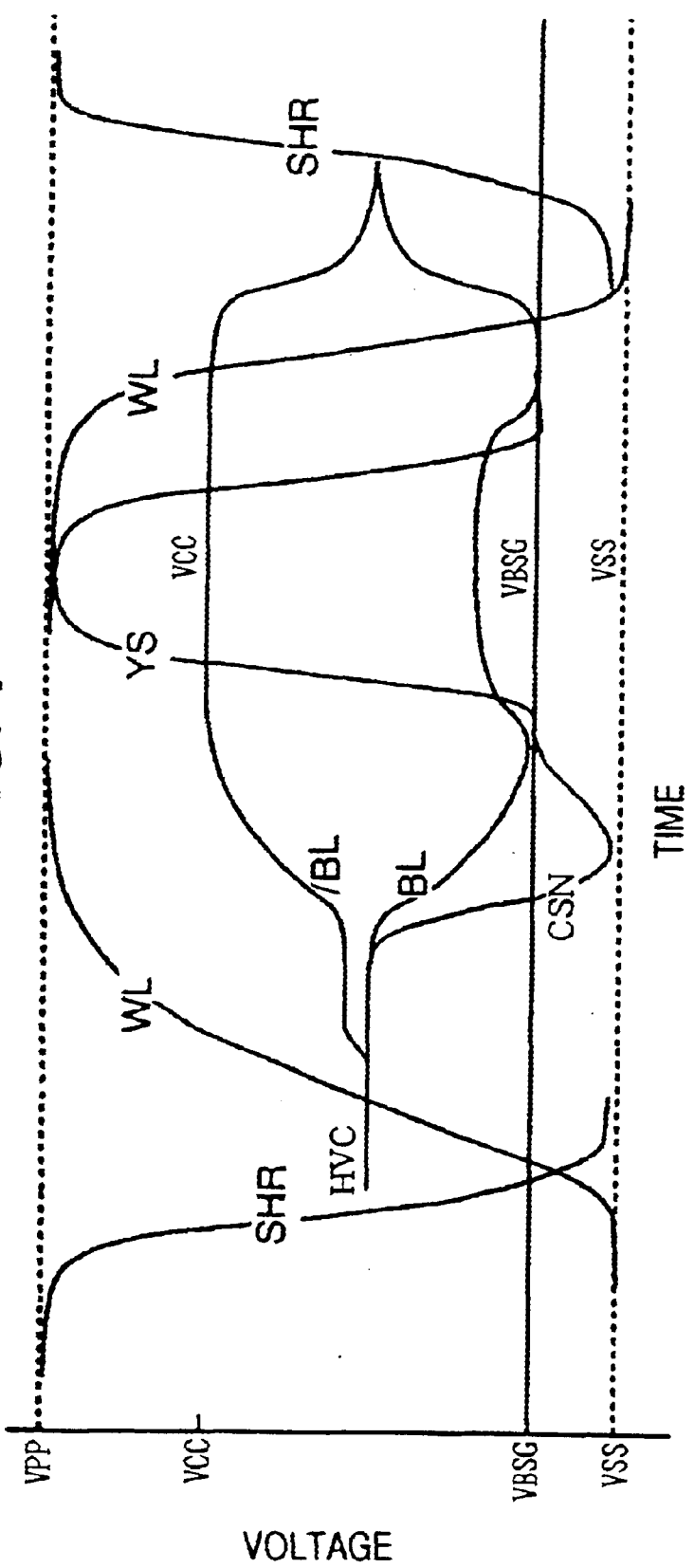

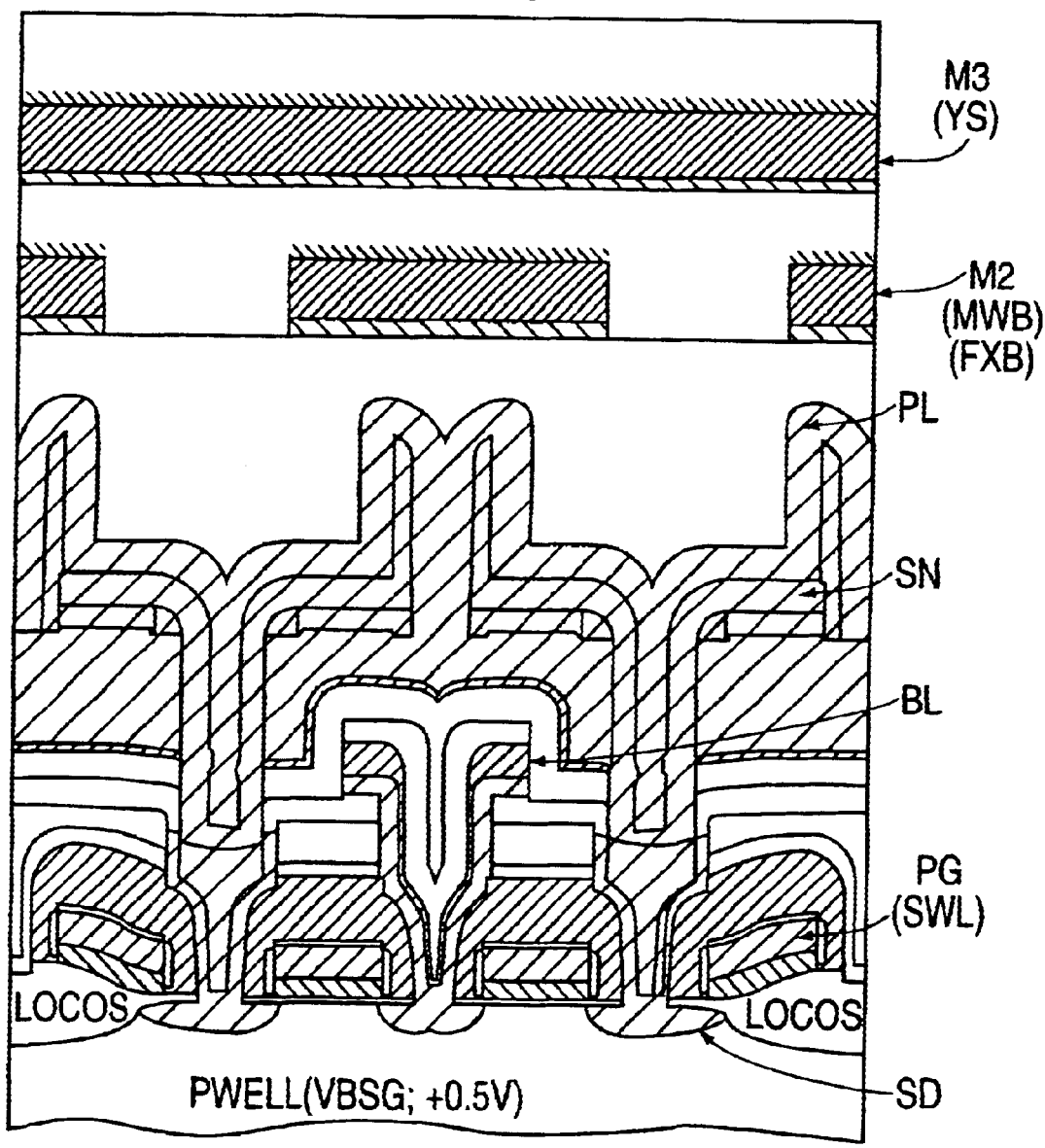

FULL-FACE DWELL (VPP)

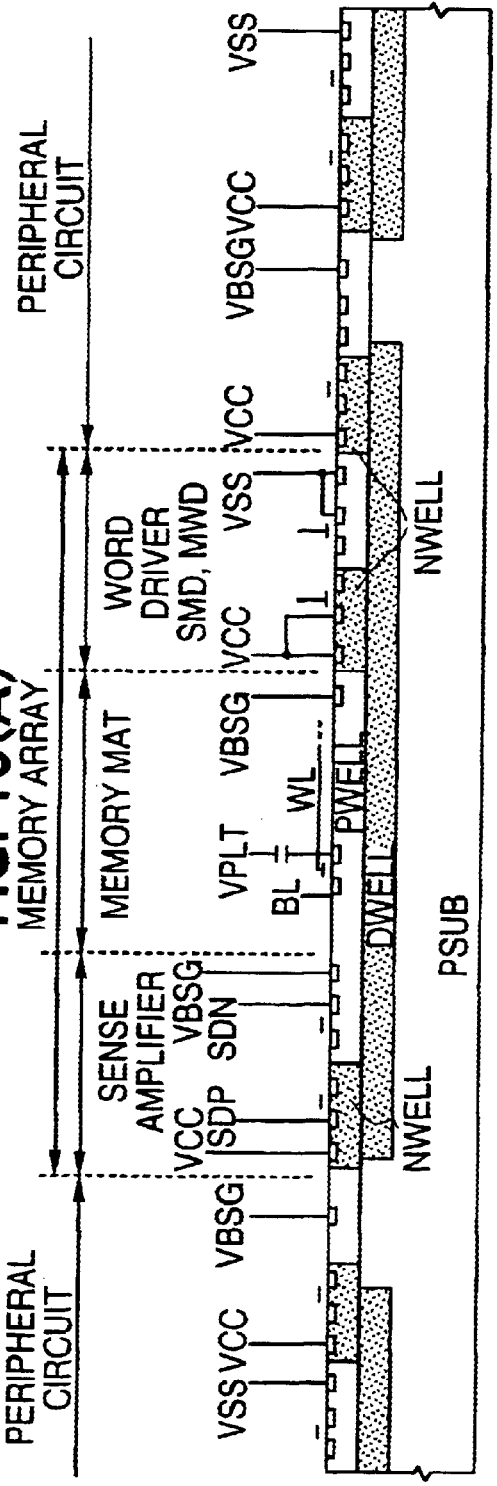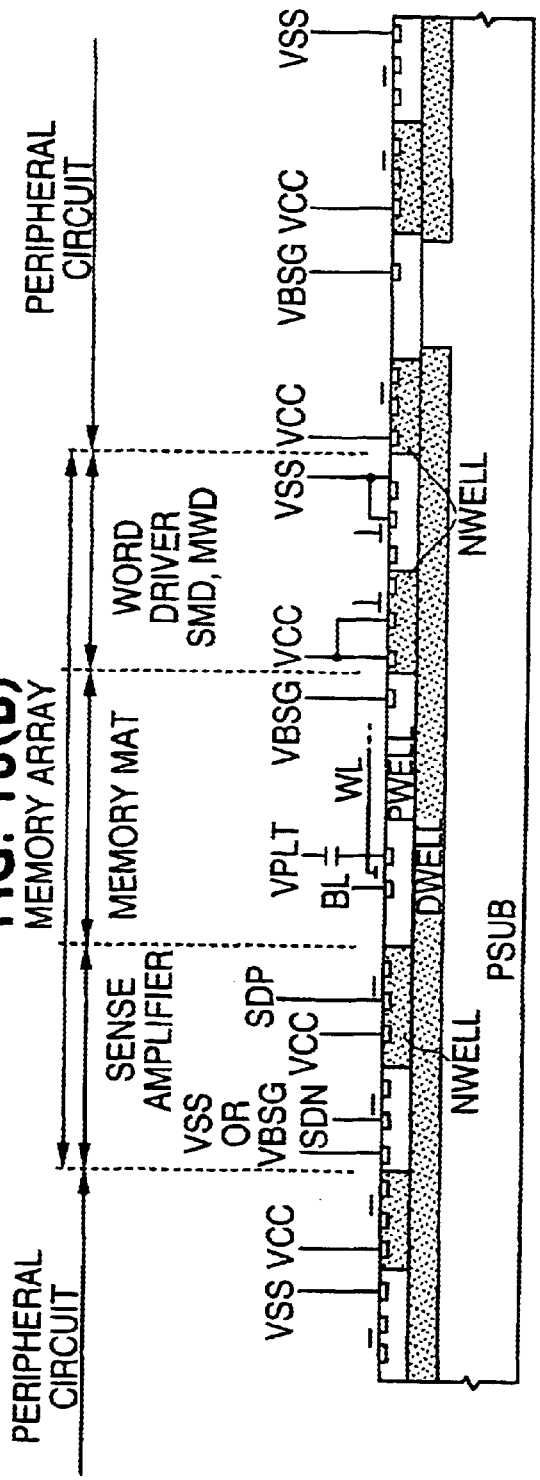

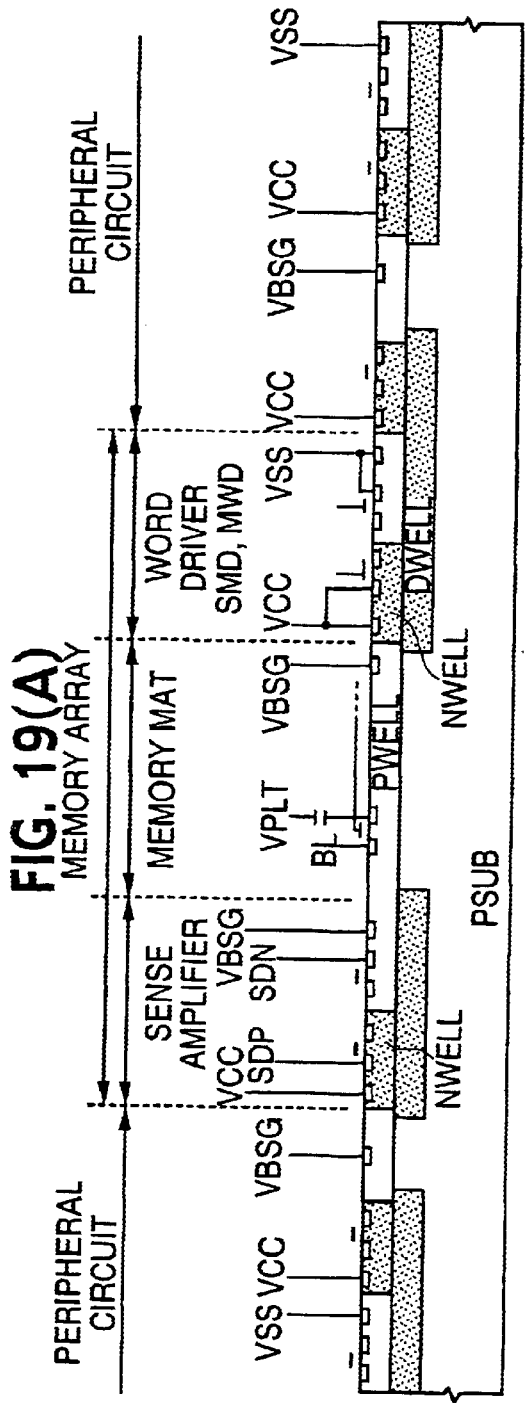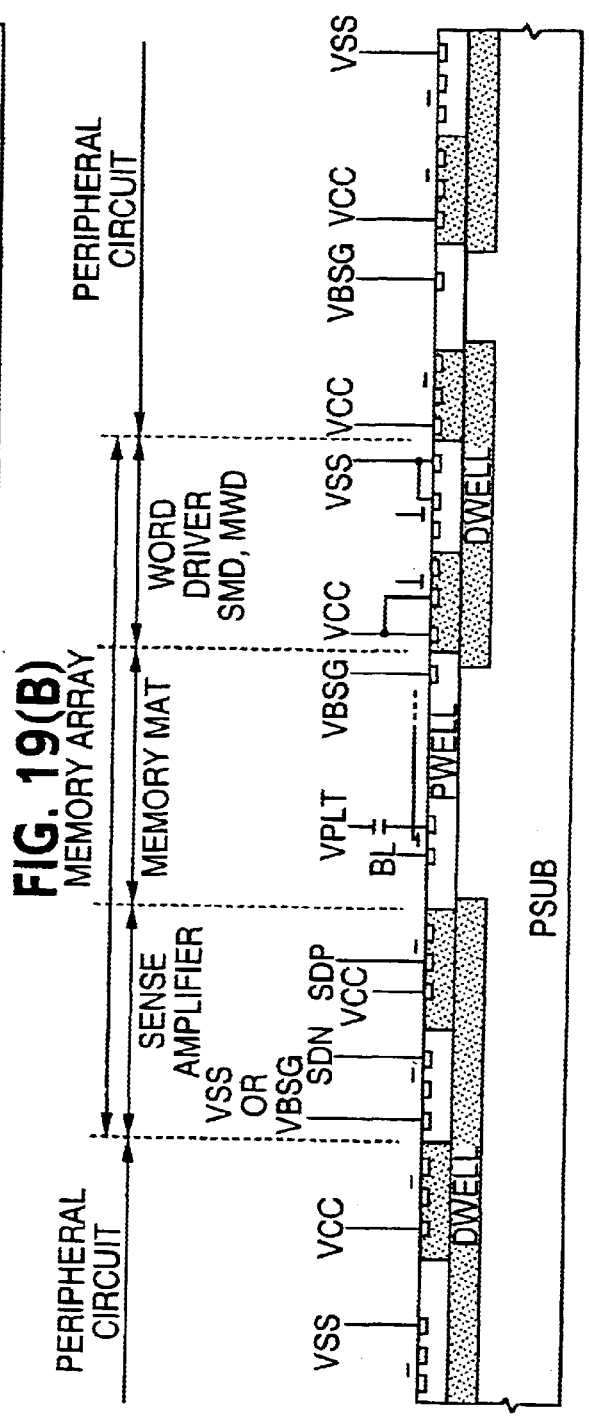

SEMICONDUCTOR INTEGRATED CIRCUIT DEVICE

TECHNICAL FIELD

The present invention relates to a semiconductor integrated circuit device and, more particularly, to techniques adapted advantageously to a dynamic random access memory (RAM) or a semiconductor integrated circuit device incorporating such a memory.

BACKGROUND OF THE INVENTION

There exist dynamic RAMs with voltage generation circuits that use an internal charge pump circuit to boost a back bias voltage fed to a substrate and a selected voltage on word lines. One such dynamic RAM is disclosed illustratively in Japanese Published Unexamined Patent Application No. Hei 3-214699.

As is well known, a dynamic memory cell is made up of an address selection MOSFET and a data storage capacitor. A data item is stored according to whether the capacitor is charged or not charged. As the storage capacity is raised, the number of memory cells to be refreshed per refresh operation increases. This can hinder word lines from getting driven by an internal voltage boosted by the charge pump circuit. To further enhance the storage capacity thus requires prolonging the period of time in which data are held in memory cells and reducing the number of memory cells selected per refresh operation. Meeting such requirements would alleviate the load of the internal voltage in effect when word lines are selected for refresh operations.

A capacitor that holds data is discharged by means of two currents: a sub threshold leakage current flowing through a source-drain path of the address selection MOSFET in an off-state; and a PN junction leakage current flowing between the source and drain connected to storage nodes of the capacitor on the one hand, and a substrate or a well in which the source and drain are formed on the other hand. In a dynamic RAM of the above-mentioned type, a back bias voltage is supplied to the substrate for two purposes: to reduce the sub threshold leakage current by raising a threshold voltage of each address selection MOSFET, and to lower the parasitic capacity of a source and a drain diffusion layer connected to the bit line side.

In the dynamic RAM described above, the maximum allowable field intensity of a gate insulating film has been dropping recently as elements are getting smaller than ever. The conventional idea of simply raising the threshold voltage of the address selection MOSFET for a full-write operation in the memory cell above is no longer tenable, as the inventors of this invention have found. That is, suppose that an operating voltage (High level on bit lines) lowered to about 2.5 V is desired to allow for an increase of the selected level of a word line by as much as the raised threshold voltage in order to perform a full-write operation on the memory cell in question. In that case, the threshold voltage of the address selection MOSFET is illustratively as high as 1.5 V. This means that raising the threshold value to get a boosted voltage of about 4 V for the selection of a word line would exhaust necessary margins for the maximum allowable field-intensity in effect.

It is therefore an object of the present invention to provide a semiconductor integrated circuit device that incorporates a dynamic RAM comprising smaller elements and offering longer data holding times than before. Another object of the invention is to provide a semiconductor integrated circuit device including a dynamic RAM which is simpler to process and which comprises smaller elements while offering longer data hold times than ever before. Other objects, features and advantages of the invention will become more apparent upon a reading of the following description and appended drawings.

DISCLOSURE OF INVENTION

The invention envisages a semiconductor integrated circuit device wherein a positive bias voltage higher than a ground potential of the circuit is generated and supplied as a bias voltage to P-type well regions in which are formed address selection MOSFETs of dynamic memory cells.

BRIEF DESCRIPTION OF DRAWINGS

FIG. 7 is a timing chart showing how the circuit of FIG. 6 typically operates;

FIG. 8 is a cross-sectional view of elements constituting a dynamic memory cell embodying the invention;

FIGS. 18(A) and 18(B) are cross-sectional views of elements constituting another dynamic RAM embodying the invention;

FIGS. 19(A) and 19(B) are cross-sectional views of elements constituting another dynamic RAM embodying the invention;

BEST MODE FOR CARRYING OUT THE INVENTION

The invention will now be described in more detail with reference to the accompanying drawings.

Figure 1:
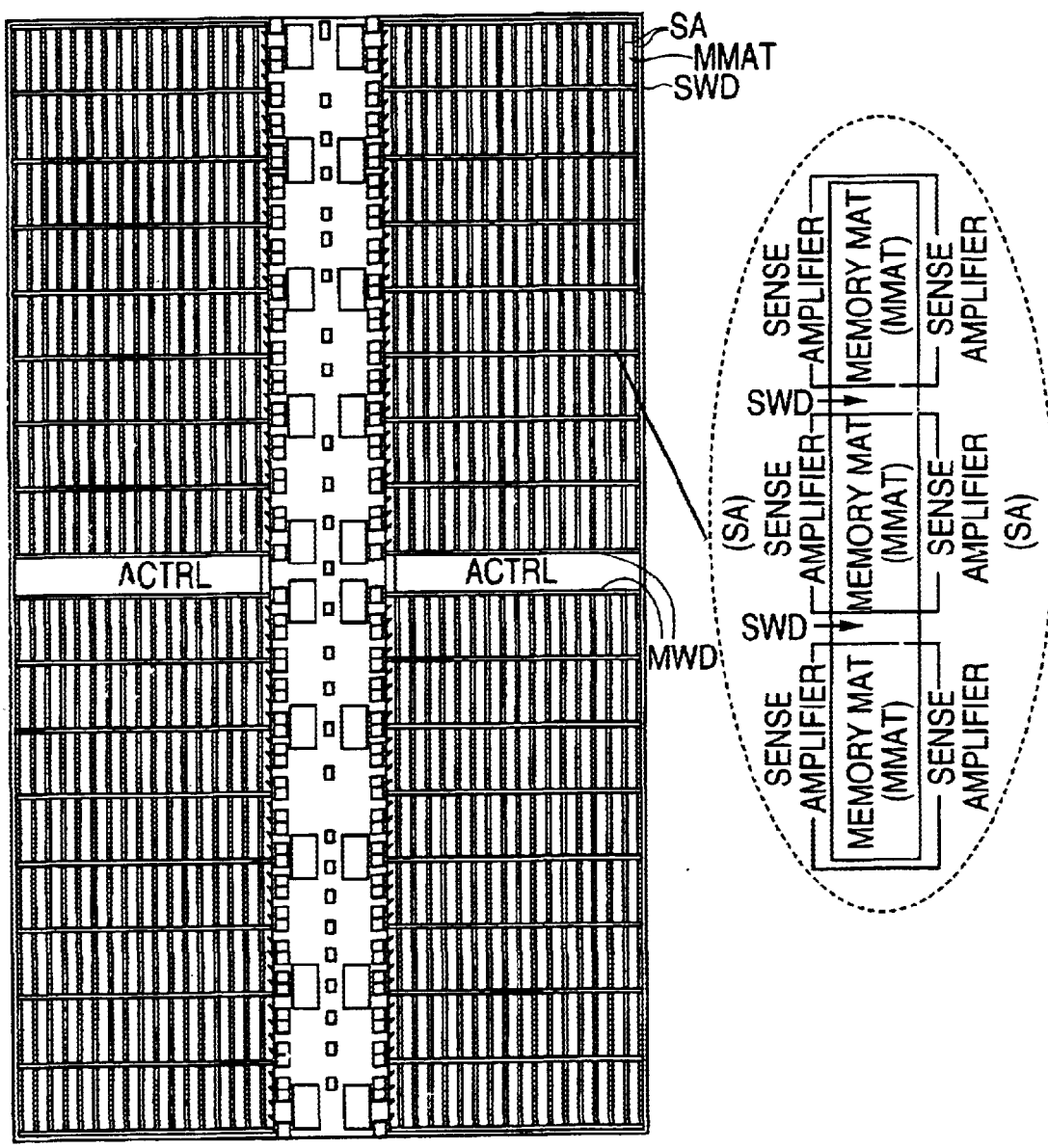
FIG. 1 is a schematic layout diagram of a dynamic RAM embodying the invention.

FIG. 1 is a schematic layout diagram of a dynamic RAM embodying the invention. Circuit blocks constituting the dynamic RAM are formed by known semiconductor integrated circuit fabrication techniques on a single semiconductor substrate made illustratively of single crystal silicon.

The dynamic RAM of FIG. 1 illustratively offers a storage capacity of about 64 megabits. A memory array is principally composed of four memory blocks. A semiconductor chip is divided in two longitudinally, the bisected portions comprising two memory arrays each. The central portion of the chip is furnished with I/O interface circuits and internal voltage generation circuits including address input circuits, data I/O circuits and bonding pad arrays.

The four memory blocks are divided into two groups of two memory blocks each longitudinally as well as horizontally. The two longitudinally arranged groups each made of two memory blocks have main word drivers MWD located in a middle portion bisecting each group horizontally. Each main word driver generates a selection signal for selecting main word lines that extend in a manner penetrating each memory block. One memory block comprises dynamic memory cells offering a storage capacity of 4 kilobits in the direction of main word lines as well as a storage capacity of 4 kilobits in the direction of pair bit lines (also called data lines). Four such memory blocks provide as much as 64 megabits of memory capacity (=4 K×4 K×4K).

Each memory block is divided into eight portions in the direction of main word lines. Each of the memory block divisions is furnished with a sub word driver SWD. Each sub word driver WSD is one-eighth of a main word line in length, and generates a selection signal for selecting sub word lines that extend in parallel with the driver. In this embodiment, each word line corresponds illustratively to four sub word lines arranged in the direction of pair bit lines so as to reduce the number of main word lines, i.e., to ease the wiring pitch of the main word lines. That is, each sub word line is divided into eight parts in the main word line direction, and the sub word lines are arranged in groups of four in the pair bit line direction. Any one of the four sub word lines is selected by a sub word selection line driver, to be described later. The sub word selection line driver generates a selection signal for selecting one of the four sub word lines that extend in the direction in which the sub word drivers are arranged.

In FIG. 1, sense amplifiers SA are arranged in the longitudinal direction of the semiconductor chip. Column decoders (column Dec) are located toward the center of the chip. Array control circuits ACTRL bisect the memory blocks horizontally and supply timing signals needed to operate address decoders and other components.

As described above, one memory array has the storage capacity of 4 kilobits in the pair bit line direction. However, if a 4K memory cell portion were connected to a single pair bit line, the parasitic capacity of the pair bit line would be raised too high to read out a signal level that should be acquired due to a capacity differential with regard to a data storage capacitor of a small size. Such eventuality is averted by dividing each memory array into 16 parts in the pair bit line direction. That is, the pair bit lines are each divided into 16 parts by the sense amplifiers SA. Illustratively, as will be described later, the sense amplifiers SA each adopt a shared sense system. Except for the sense amplifiers located at both ends of each memory array, the sense amplifiers are located in the middle of the pair bit lines that extend right and left. Each sense amplifier is connected selectively to either the left-hand or the right-hand side pair bit lines.

Figure 2:
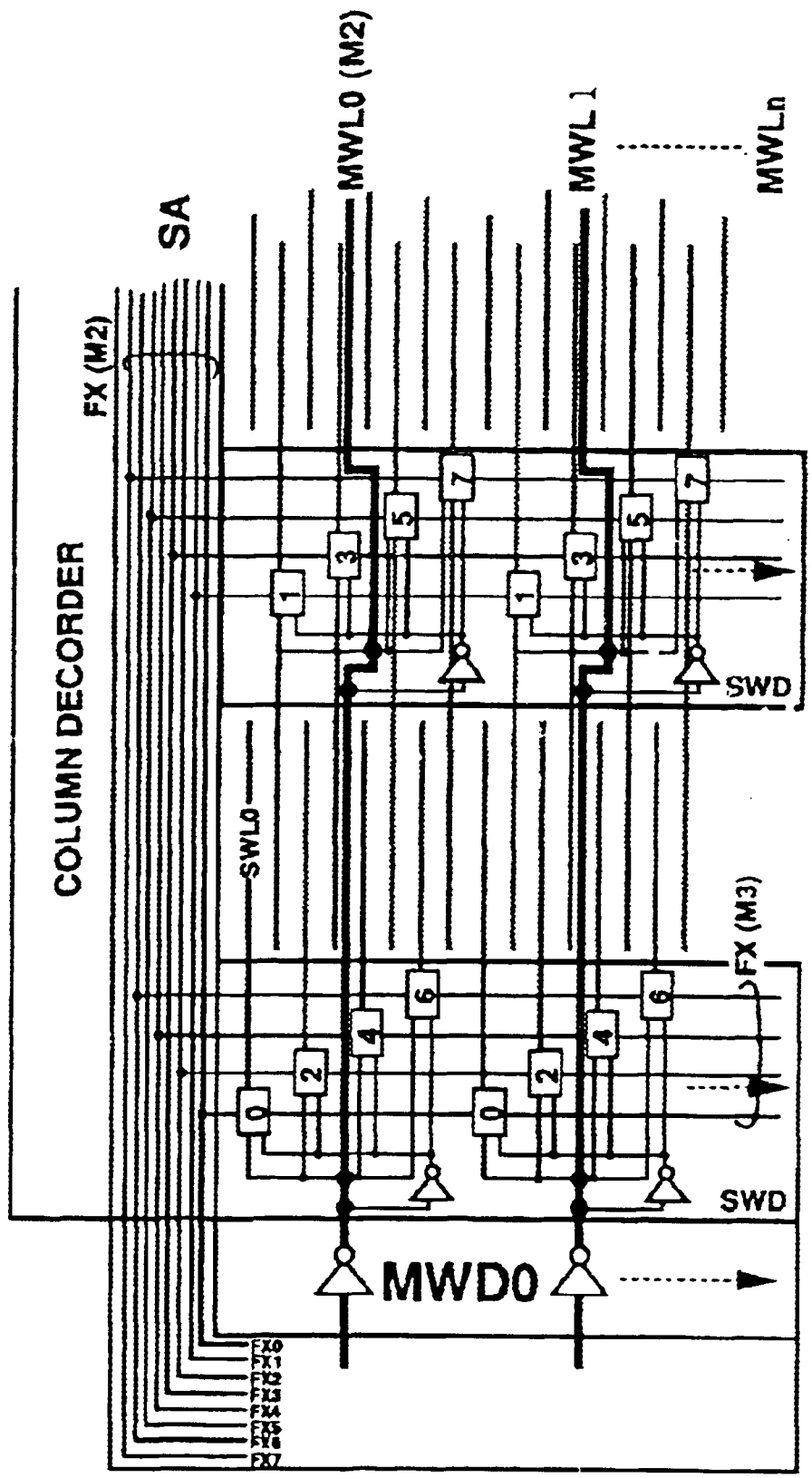
FIG. 2 is a partial circuit diagram depicting relations between main word lines and sub word lines of a memory array shown in FIG. 1.

FIG. 2 is a partial block diagram depicting relations between main word lines and sub word lines of the above-described memory array. In FIG. 2, two main word lines MWL0 and MWL1 are shown as representative examples. The main word line MWL0 is selected by a main word driver MWD0. The main word line MWL1 is selected likewise by the same main word driver.

The main word line MWL0 corresponds to eight subword lines paralleling the main word line in its extending direction. Two groups of the sub word lines are shown as representative examples in FIG. 2. The sub word lines, even-numbered (0–6) in one group and odd-numbered (1–7) in the other group, are arranged alternately as they are furnished to one memory cell array. The sub word drivers SWD located between the memory cell arrays generate a selection signal each for selecting sub word lines in the right- and left-hand side memory blocks. That is not the case with the even-numbered sub word lines (0–6) adjacent to the main word driver and the odd-numbered sub word lines (1–7) at an extreme end of the main word lines (i.e., on the opposite side of the word drivers)

As mentioned above, each memory block is divided into eight portions in the main word line direction. However, because the sub word lines corresponding to two memory blocks are actually selected simultaneously by the sub word drivers SWD, each memory block is in fact divided into four portions. In the setup above, the sub word lines are divided into those that are even-numbered (0–6) and those that are odd-numbered (1–7), and each memory block is flanked by the sub word drivers SWD. In that setup, the actual pitch of the sub word lines SWL arranged at a high density to match the memory cell layout is doubly eased within the sub word drivers SWD. The sub word drivers SWD and sub word lines SWL0, etc., are thus laid out in an efficient manner.

One sub word driver SWD supplies a common selection signal to four sub word lines 0–6 (1–7). The driver also feeds the sub word lines with an inverted signal generated by an inverter. Sub word selection lines FX are provided to select one of the four sub word lines. Illustratively, there are eight sub word selection lines FX0 through FX7. Of these sub word selection lines, the even-numbered lines FX0–FX6 are supplied to the even-numbered sub word drivers 0–6, and the odd-numbered lines FX1–FX7 to the odd-numbered sub word drivers 1–7. Illustratively, the sub word selection lines FX0 through FX7 are formed by a metal wiring layer M2 that is a second layer in the peripheral region of the arrays. Where they intersect the main word lines MWL0 through MWLn constituted by the same metal wiring layer M2, the sub word selection lines FX0 through FX7 are formed by a metal wiring layer M3 making up a third layer.

Figure 3:
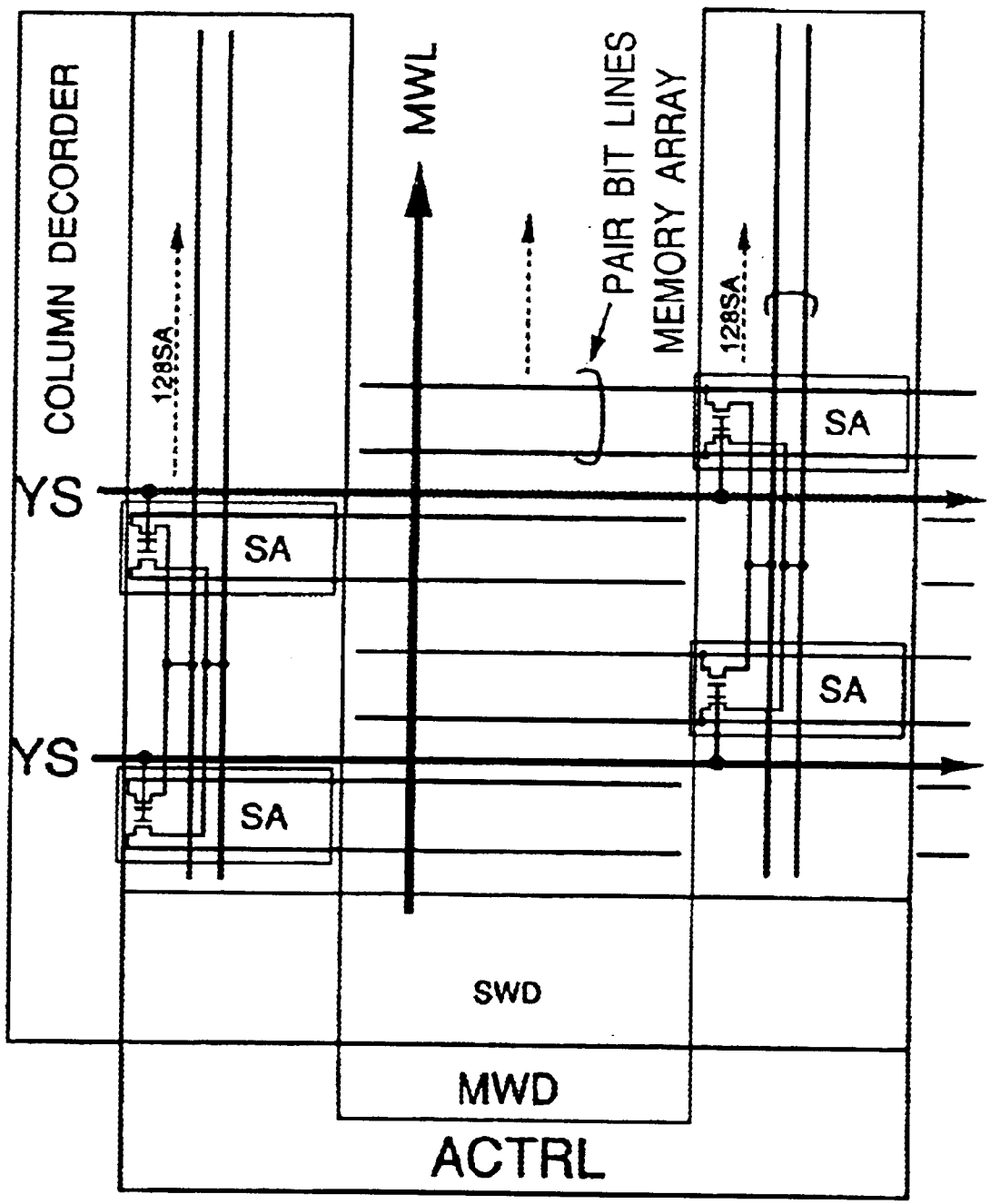
FIG. 3 is a partial circuit diagram illustrating relations between main word lines and sense amplifiers included in FIG. 1.

FIG. 3 is a partial block diagram illustrating relations between the main word lines on the one hand and the sense amplifiers on the other hand. In FIG. 3, one main word line MWL is shown as a representative example. The main word line MWL is selected by a main word driver MWD. Adjacent to the main word driver MWD are sub word drivers corresponding to the even-numbered sub word lines.

Although not shown in FIG. 3, pair bit lines are furnished in a manner intersecting perpendicularly the sub word lines that parallel the main word line MWL. In this embodiment, the pair bit lines are grouped illustratively into those that are even-numbered and those that are odd-numbered. The two groups of pair bit lines are each provided with sense amplifiers SA that are located on both sides of the memory array. Although the sense amplifiers SA operate on the shared sense principle as mentioned above, those at the extreme ends are not directly connected to pair bit lines. Instead, such sense amplifiers are connected via shared switching MOSFETs to the pair bit lines, as will be described later.

In the above setup where the sense amplifiers SA are distributed on both sides of the memory block, the pair bit lines are divided into are even-numbered line group and are odd-numbered line group. The arrangement helps ease the pitch of the sense amplifiers. In other words, the pair bit lines are laid out at a high density while there is provided a sufficient element area for accommodating the sense amplifiers SA. I/O lines, located along the sense amplifiers SA, are connected via column switches to the pair bit lines. The column switches are each tunel of a switching MOSFET. The gate of each switching MOSFET is connected to a column selection line YS that carries a selection signal of a column decoder.

Figure 4:
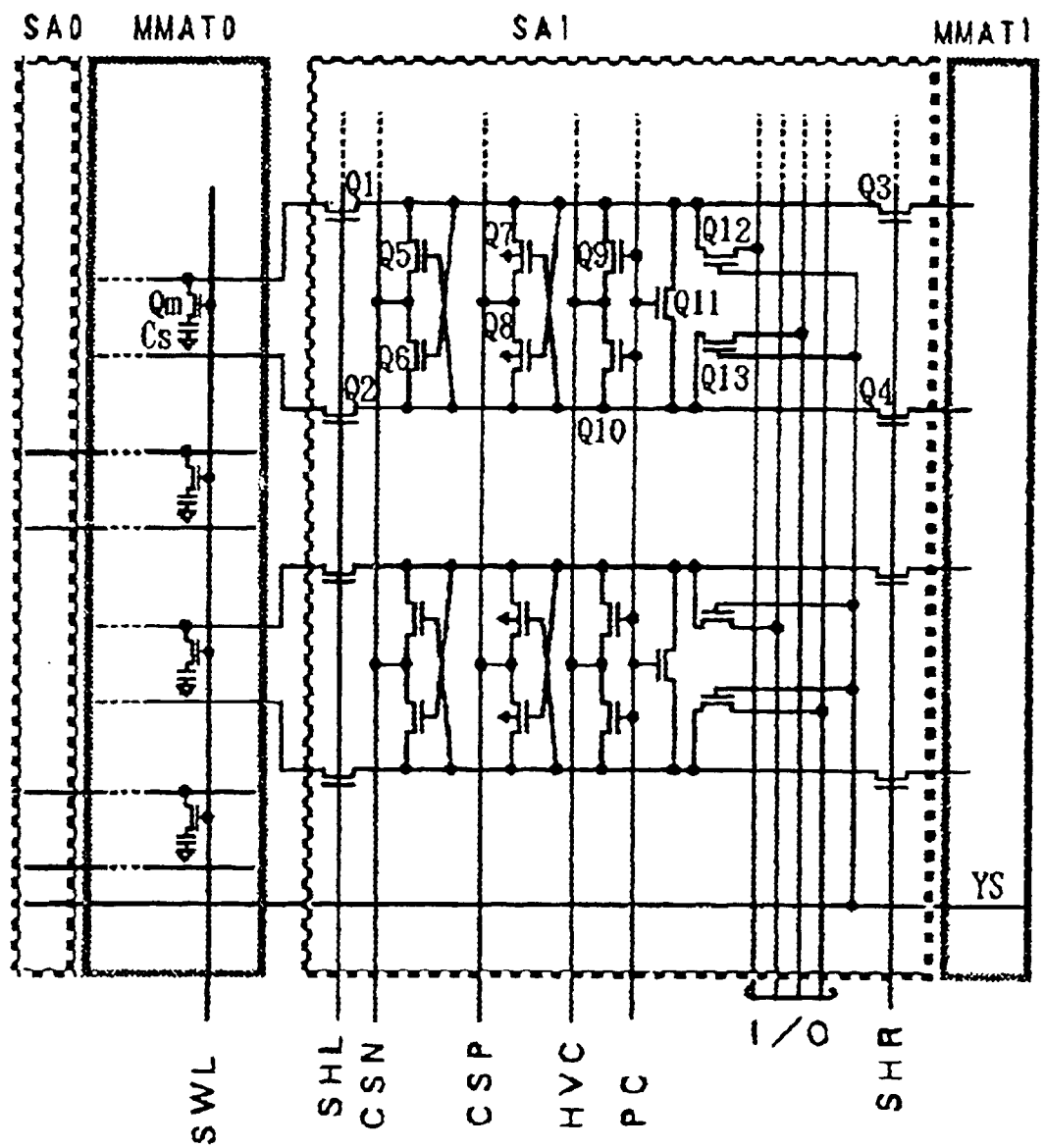
FIG. 4 is a partial circuit diagram of a sense amplifier in the inventive dynamic RAM.

FIG. 4 is a partial circuit diagram of a sense amplifier in the inventive dynamic RAM. FIG. 4 illustrates a sense amplifier SA1 and its associated circuits located between memory cell arrays (also called memory mats) MMAT0 and MMAT1. The memory cell array MMAT1 is indicated as a black box, and so is a sense amplifier SA0 at an extreme end of the diagram.

Four dynamic memory cells are shown as representative examples that correspond to the sub word line SWL furnished to the memory mat MMAT0. Each dynamic memory cell is constituted by an address selection MOSFET Qm and a data storage capacitor Cs. The gate of each address selection MOSFET Qm is connected to the sub word line SWL. The drain of the MOSFET Qm is connected to bit lines, and its source is connected to one node of the data storage capacitor Cs. The other node of the data storage capacitor Cs is fed commonly with a plate voltage.

Each pair of bit lines is arranged in parallel as shown in FIG. 4. The bit lines are crossed as needed to balance their capacities. The pair bit lines are connected to I/O nodes of a sense amplifier unit circuit by way of shared switching MOSFETs Q1 and Q2. Each unit circuit of the sense amplifier SA is made of N-channel MOSFETs Q5 and Q6 and of P-channel MOSFETs Q7 and Q8 with their gates and drains cross-connected to form a latch arrangement. The sources of the N-channel MOSFETs Q5 and Q6 are connected to a common source line CSN. The sources of the P-channel MOSFETs Q7 and Q8 are connected to a common source line CSP. The common source lines CSN and CSP are provided respectively with an N- and a P-channel power switching MOSFET. A sense amplifier activation signal turns on the power switching MOSFETs to supply a voltage needed to operate the sense amplifier.

The sense amplifier unit circuit above is furnished with a precharging circuit (or equalizing circuit) constituted by an MOSFET Q11 short-circuiting the pair bit lines and by MOSFETs Q9 and Q10 supplying a half-precharging voltage HVC to the pair bit lines. The gates of the MOSFETs Q9, Q10 and Q11 are commonly fed with a precharging signal PC.

MOSFETs Q12 and Q13 constitute column switches whose switching action is controlled by a column selection signal YS. In this embodiment, one column selection signal YS is arranged to select four pairs of bit lines. Column switches of the same type are included in the sense amplifier SA0 shown as a black box. The two sense amplifiers SA0 and SA1 on both sides of the memory mat MMAT0 correspond to the even-numbered and the odd-numbered pair bit lines. In that arrangement, the column selection signal YS is used to select four pairs of bit lines, two pairs shown illustratively on the side of the sense amplifier SA1, another two pairs included but not shown on the side of the sense amplifier SA0. The pair bit lines are connected, two pairs at a time, to a common I/O line via the column switches.

The sense amplifier SA1 is connected to similar odd-numbered pair bit lines of the memory mat MMAT1 via shared switching MOSFETs Q3 and Q4. The even-numbered pair bit lines of the memory mat MMAT1 are connected to a sense amplifier SA2, not shown, on the right-hand side of the memory mat MMAT1 by way of shared switching MOSFETs corresponding to the shared switching MOSFETs Q1 and Q2. Such repetitive wiring patterns connect the pair bit lines to the sense amplifiers located between the memory mats (memory cell arrays) constituting the memory arrays. Illustratively, selecting the sub word line SWL of the memory mat MMAT0 turns on the right-hand side shared switching MOSFETs of the sense amplifier SA0 and the left-hand side shared switching MOSFETs of the sense amplifier SA1. It should be noted that the sense amplifier SA0 at the extreme end has the right-hand side shared switching MOSFETs only. A signal SHL is a left-hand side shared selection signal, and a signal SHR is a right-hand side shared selection signal.

Figure 5:
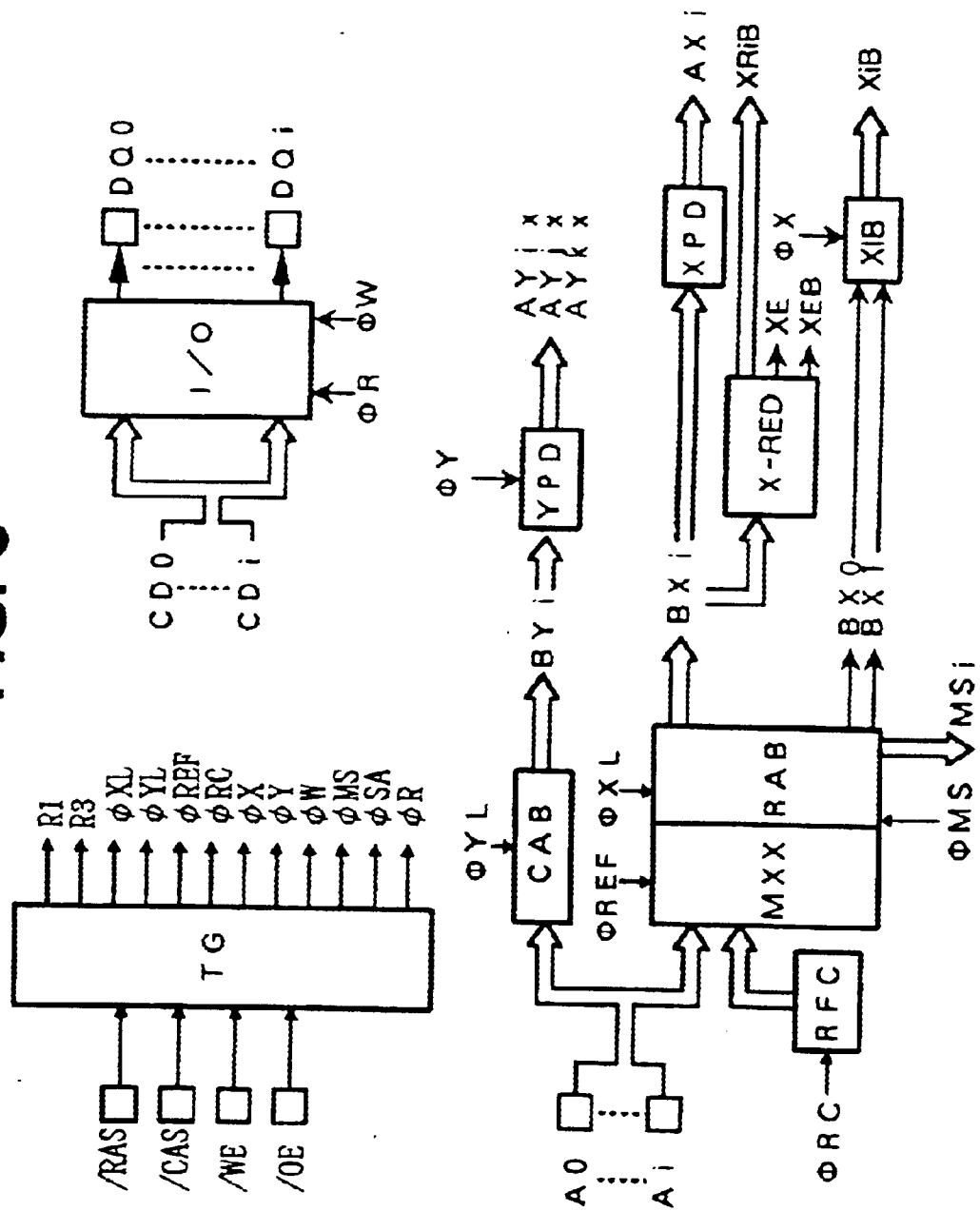
FIG. 5 is a schematic block diagram of peripheral circuits in the inventive dynamic RAM.

FIG. 5 is a schematic block diagram of peripheral circuits in the inventive dynamic RAM. A timing control circuit TG receives a row address strobe signal/RAS, a column address strobe signal/CAS, a write enable signal/WE and an output enable signal/OE from external terminals. In turn, the timing control circuit TG determines an operation mode and generates various timing signals needed to operate internal circuits in that mode. In the description that follows and in the accompanying drawings, a slash (/) prefixed to a reference character and a letter B suffixed to a reference character (e.g., bit line BLB) signify that the Low level is the active level.

Signals R1 and R3 are row-related internal timing signals that are used to perform row selecting operations. A timing signal $\phi XL$ for getting and holding a row address is supplied to a row address buffer RAB. Given the timing signal $\phi XL$, the row address buffer RAB acquires an address from address terminals A0 through Ai and holds the acquired address in a latch circuit.

A timing signal $\phi YL$ used to get and hold a column address is fed to a column address buffer CAB. Upon receipt of the timing signal $\phi YL$, the column address buffer CAB acquires a column address from the address terminals and holds it in a latch circuit.

A signal $\phi REF$ generated in refresh mode is sent to a multiplexer MXX at the input of the row address buffer RAB. In refresh mode, the signal $\phi REF$ causes the multiplexer MXX to switch to a refresh address signal generated by a refresh address counter circuit RFC. The refresh address counter circuit RFC generates the refresh address signal by counting up stepping pulses φRC generated for refresh purposes by the timing control circuit TG. This embodiment has two kinds of refresh mode: auto-refresh and self-refresh.

A timing signal φX is a word line selection timing signal that is fed to a decoder XIB. Given the timing signal φX, the decoder XIB generates four types of word line selection timing signal XiB depending on the low-order two bits of a decoded address signal. A timing signal φY is a column selection timing signal that is supplied to a column pre-decoder YPD which in turn outputs column selection signals AYix, AYjx and AYkx.

A timing signal φW is a control signal for designating a write operation, and a timing signal φR is a control signal that specifies a read operation. The timing signals φW and φR are sent to an input/output (I/O) circuit. For a write operation, the I/O circuit given the suitable timing signal activates an input buffer included in the circuit while bringing its output buffer into an output high-impedance state. For a read operation, the I/O circuit given the appropriate timing signal activates the output buffer while bringing the input buffer into the output high-impedance state.

A timing signal φMS is used illustratively to designate a memory array selecting operation and is sent to the row address buffer RAB. In synchronism with the signal 0MS thus supplied, the row address buffer RAB outputs a selection signal MSi. A timing signal φSA for specifying a sense amplifier operation is used to generate an activation pulse signal SAE for use by the sense amplifiers, as will be described later.

In FIG. 5, a row-related redundant circuit X-RED is shown as a representative example. The circuit X-RED includes a storage circuit for storing a defective address and an address comparator. A stored defective address is compared with an internal address signal BXi output by the row address buffer RAB. In case of a mismatch between the defective address and the address signal, the circuit X-RED drives a signal XE High and brings a signal XEB Low to enable the operation of a normalizing circuit. If the input internal address signal BXi is found to match the stored defective address, the circuit X-RED brings the signal XE Low to inhibit a selecting operation on the defective main word line of the normalizing circuit while driving the signal XEB High to output a selection signal XRiB to select one spare main word line.

Figure 6:
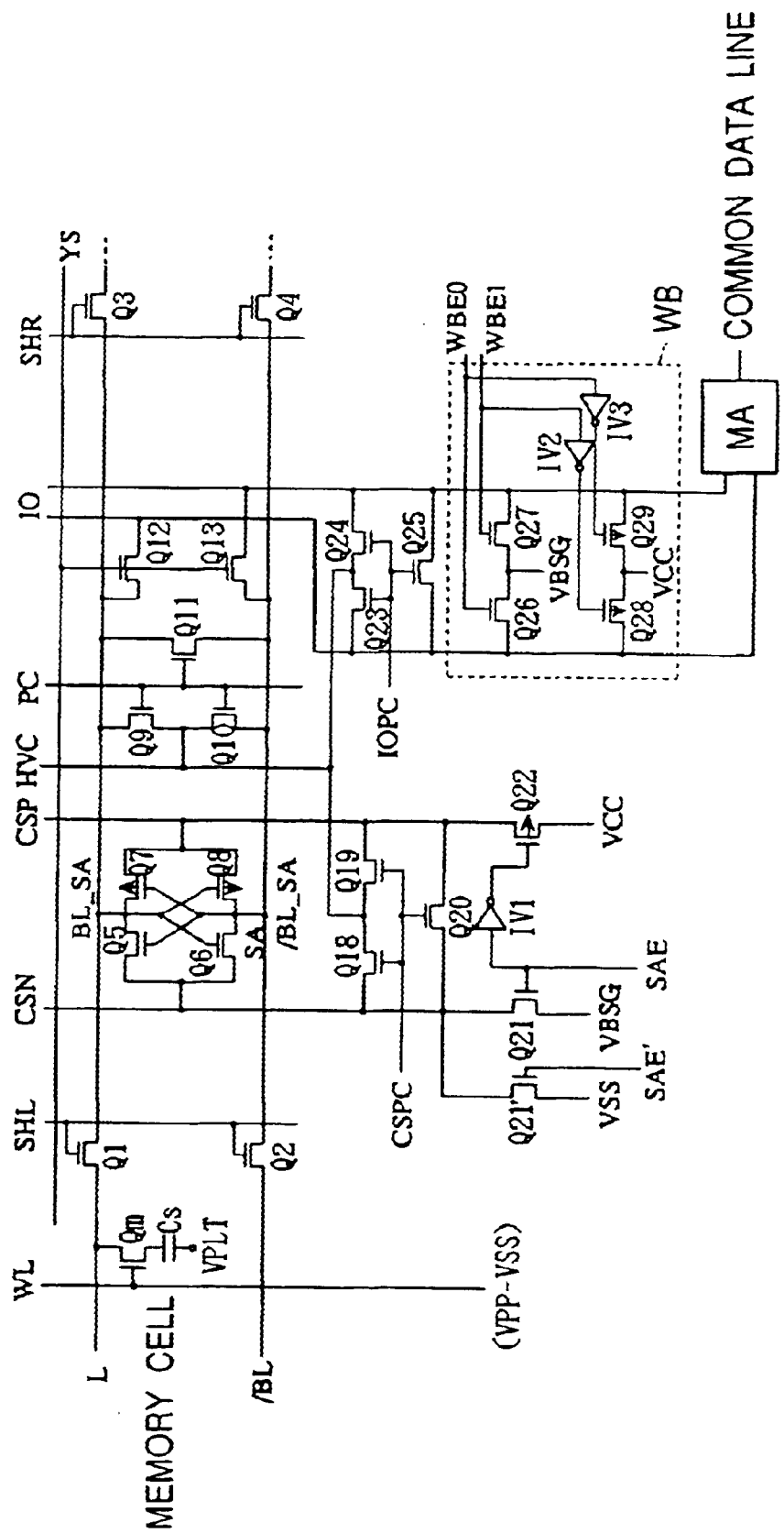
FIG. 6 is a partial circuit diagram of a memory cell array in the inventive dynamic RAM.

FIG. 6 is a partial circuit diagram of a memory cell array included in the inventive dynamic RAM. In FIG. 6, one word line and a pair of bit lines BL,/BL are shown as representative examples, and so are a sense amplifier, pre-charging circuits, write- and read-related circuits associated with the word and bit lines.

As mentioned earlier, a dynamic memory cell is made of an address selection MOSFET Qm and a data storage capacitor Cs. The gate of the address selection MOSFET Qm is connected to the word line WL. The source and drain on one side of the MOSFET Qm are connected to the bit line BL; the source and drain on the other side are connected to a storage node of the data storage capacitor Cs. The other node of the data storage capacitor Cs is fed with a common plate voltage VPLT. Illustratively, if the above-described split word line setup comprising main and sub word lines is in place, the word line WL here should be considered a sub word line.

The bit lines BL and /BL are arranged in parallel as shown in FIG. 6, and are crossed as needed to balance their capacities. The pair bit lines BL and /BL are connected via switching MOSFETs Q1 and Q2 to I/O nodes BL-SA and /BL-SA of the sense amplifier. Each of the unit circuits constituting the sense amplifier SA is made of a CMOS latch circuit comprising N-channel MOSFETs Q5 and Q6 as well as P-channel MOSFETs Q7 and Q8 with their gates and drains cross-connected to form a latch arrangement. The sources of the N-channel MOSFETs Q5 and Q6 are connected to a common source line CSN, and the source of the P-channel MOSFETs Q7 and Q8 are connected to a common source line CSP. The common source lines CSP and CSN are commonly connected to the sources of similar P- and N-channel MOSFETs of other CMOS latch circuits of the same type.

The common source line CSP is furnished with a P-channel power switching MOSFET Q22. The gate of the MOSFET Q22 is supplied with an output signal from an inverter circuit IV1 that receives a sense amplifier activation signal SAE. With the timing signal SAE driven High, the MOSFET Q22 is turned on synchronously to feed a supply voltage VCC to the common source line CSP. The common source line CSN corresponding to the N-channel MOSFETs Q5 and Q6 is provided with an N-channel power switching MOSFET Q21. The gate of the MOSFET Q21 is fed with the timing signal SAE. When the timing signal SAE is driven High, the MOSFET Q21 is turned on synchronously to feed a well voltage VBSG (to be described later) to the common source line CSN.

Illustratively, the MOSFET Q21 is connected in parallel to an MOSFET Q21' that is supplied with a timing signal SAE'. The timing signal SAE' is brought High temporarily at the start of a sense amplifier operation. When the timing signal SAE is driven High from Low, the MOSFET Q21' is temporarily turned on to apply momentarily a ground potential VSS that is lower than the internal voltage VBSG. That is, an effective overdrive is carried out to boost the speed of sense amplifier operations.

The I/O nodes BL-SA and /BL-SA of the sense amplifier SA above are furnished with a precharging circuit constituted by a short-circuiting MOSFET Q11 and by MOSFETs Q9 through Q11 supplying a half-precharging voltage HVC to the pair bit lines. The gates of the MOSFETs Q9 through Q11 are commonly fed with a precharging signal PC. The common source lines CSP and CSN of the sense amplifier SA are also furnished with a precharging circuit constituted by an MOSFET Q20 short-circuiting the lines CSP and CSN and by MOSFETs Q18 and Q19 supplying the half-precharging voltage HVC. The gates of the MOSFETs Q18 through Q20 are commonly fed with a precharging signal CSPC.

The I/O nodes BL-SA and /BL-SA of the sense amplifier SA above are connected to input/output lines IO via N-channel column switching MOSFETs Q12 and Q13. The gates of the column switching MOSFETs Q12 and Q13 are supplied with the column selection signal YS. The I/O lines IO are also furnished with a precharging circuit made of MOSFETs Q23 through Q25. Driving a precharging signal IOPC High turns on the MOSFETs Q23 through Q25 to effect a half-precharging operation. The I/O lines IO are connected to an input terminal of the main amplifier MA. The I/O lines IO are also connected to an output terminal of a write buffer WB constituted by N-channel MOSFETs Q26 and Q27 generating a Low-level (VBSG) write signal and by P-channel MOSFETs Q28 and Q29 generating a High-level (VCC) writesignal.

The MOSFETs Q26 through Q29 in the write buffer WB are controlled by write signals WEB0 and WEB1 as well as by inverted signals generated by inverters IV2 and IV3. When the write signal WEB0 is driven High and WEB1 Low, the MOSFETs Q26 and Q29 are turned on to generate a High-level (VCC)/Low-level (VBSG) write signal. When the write signal WEB0 is brought Low and WEB1 High, the MOSFETs Q27 and Q28 are turned on to generate a Low-level/High-level write signal. In any operation other than the write operation, the MOSFETs Q26 through Q29 are turned off to bring about the output high-impedance state.

The sense amplifier SA of this embodiment is what is known as a shared sense amplifier whose I/O nodes BL-SA and /BL-SA are furnished with two pairs of bit lines on the right and with another two line pairs on the left. That is, the I/O nodes BL-SA and /BL-SA are connected to the left-hand side bit lines BL and /BL via shared selection MOSFETs Q1 and Q2 and to the right-hand side bit lines, not shown, via shared selection MOSFETs Q3 and Q4. In this embodiment, the gates of the shared selection MOSFETs Q1, Q2, Q3 and Q4 are fed with the selection signals SHL and SHR. The selected level of the selection signals SHL and SHR is made the same as that of the word lines, i.e., High level such as that of the boosted voltage VPP. This allows the shared selection MOSFETs Q1 through Q4 to have the same threshold voltage as that of the address selection MOSFET Qm of each dynamic memory cell.

When the left-hand side memory mat is selected, the signal SHL causes the MOSFETs Q1 and Q2 to stay on, with the signal SHR brought Low to isolate the bit lines of the right-hand side memory mat. When the right-hand side memory mat is selected, the signal SHR causes the MOSFETs Q3 and Q4 to stay on, with the signal SHL driven Low to isolate the bit lines of the left-hand side memory mat. In a precharging period following termination of a memory access operation, the signals SHL and SHR are both driven High to precharge the bit lines on both sides.

FIG. 7 is a timing chart showing how the circuit of FIG. 6 typically operates. An address signal is accepted in synchronism with a trailing edge of a row address strobe signal/RAS, not shown. Following the row selecting operation above, the shared selection signal SHR in the nonselected state changes from the High level such as that of the supply voltage VCC to the Low level such as that of the ground potential of the circuit. The word line WL is then raised from the Low level such as that of the circuit ground potential VSS to the High level such as that of the boosted voltage VPP. The voltage rise on the word line causes one of the bit lines BL and /BL to develop a low voltage corresponding to the data charge in the selected memory cell.

Driving High the timing signals SAE and SAE', not shown, turns on the N-channel MOSFETs Q21 and Q21' and causes the common source line CSN rapidly to change its level toward the circuit ground potential. With the timing signal SAE driven High, the output signal of the inverter circuit IV1 goes Low to turn on the P-channel MOSFET Q22. The common source line CSP is raised to the High level such as that of the supply voltage VCC.

When the overdrive MOSFET Q21' is temporarily turned on as in the setup of FIG. 6, the common source line CSN of the sense amplifier has its level dropped faster and the amplified output of the sense amplifier goes Low faster. This results in an increase in the speed of amplification. With the MOSFET Q21, turned off, the sense amplifier performs its amplifying operation using the internal voltage VBSG. That in turn increases a voltage differential between the I/O nodes BL-SA and /BL-SA of the sense amplifier, one node approaching the reduced internal voltage VBSG and the other node getting closer to the supply voltage VCC. By means of the shared switching MOSFETs Q1 and Q2, one of the pair bit lines BL and /BL is brought to the Low level such as that of the internal voltage VBSG and the other bit line to the Low level such as that of the supply voltage VCC.

Driving the column selection signal YS High connects the I/O nodes BL-SA and /BL-SA to the I/O lines IO. This temporarily raises the Low level of the I/O nodes BL-SA and /BL-SA. Between an I/O line IOT and an I/O line IOB develops a level differential corresponding to an amplified signal from the sense amplifier. Read signals from the I/O lines IOT and IOB are amplified by the main amplifier MA and output onto a data common bus CB as a High and a Low level read signal such as VCC and VSS. Over the bus CS, the read signals are sent to an output circuit, not shown.

For a write operation, bringing the timing signal SAE High, not shown, causes the sense amplifier SA to start its amplifying operation in the same manner as in the read operation. Driving the column selection signal YS High connects the I/O nodes BL-SA and /BL-SA to the I/O lines IO so as to transmit write signals corresponding to the voltages VCC and VBSG. Upon transmission of a write signal for causing the stored data to be inverted in the memory cell, the I/O nodes BL-SA and /BL-SA are inverted in their levels. The inverted levels are amplified by the sense amplifier generating the supply voltage VCC and VBSG which are sent to the selected memory cell over the bit lines.

As described, if the nonselected level of the word line is regarded as the ground potential and if the Low level potential held in the data storage capacitor is a positive potential VBSG of, say, +0.5 V, then the voltage VBSG is applied as an inversely biased voltage between the source and the gate. This eliminates the need for boosting the threshold voltage for the address selection MOSFETs. That is, the address selection MOSFETs may be the same as those subject to a low threshold voltage and fabricated by the same fabrication process as that of N-channel MOSFETs that constitute peripheral circuits such as sense amplifiers and address decoders. Where such low-threshold-voltage MOSFETs (with an intrinsic threshold value of about 0.6 V) are used, the effective threshold value may be raised to about 0.8 V by the so-called substrate effect if the source potential is around +0.5 V as mentioned. This makes it possible to suppress the above-described sub threshold leakage current.

As the sub threshold leakage current drops in the manner described, a PN junction leakage current declines drastically between the diffusion layer connected to storage nodes SN on the one hand and the substrate (P-type well regions) on the other hand. That in turn prolongs the time period in which data are held in memory cells. The PN junction leakage current increases exponentially with respect to the voltage applied. It follows that reducing the applied voltage suppresses the leakage current significantly. The boosted voltage need only be boosted by as much as the threshold voltage with regard to the supply voltage VPP. For example, when the supply voltage VCC is 2.5 V, the boosted voltage VPP may be as low as 3.3 V.

FIG. 8 is a cross-sectional view of elements constituting a dynamic memory cell embodying the invention. In FIG. 8, the above-described memory cell together with its elements is shown as a representative example. The data storage capacitor of each memory cell uses as its storage node SN a polysilicon layer forming the second layer. The storage node SN is connected to the source and drain SD on one side of the address selection MOSFET. The storage node SN made of the second-layer polysilicon film is crowned by a plate electrode PL made of a polysilicon layer forming the third layer, with a thin gate insulating film interposed between the second and the third layer.

The gate of the address selection MOSFET is integral with sub word lines and constituted by a first-layer polysilicon film and by tungsten silicide (WSi) deposited on the first layer. The source and drain on the other side of the address selection MOSFET are connected to the bit lines BL formed by a polysilicon layer and by similar tungsten silicide deposited on that layer. On top of the memory cell are main word lines MWB and sub word selection lines FXB formed by a metal layer M2 constituting the second layer. On the main word lines MWB and sub word selection lines FXB are Y selection lines YS and sub word selection lines FX formed by a metal layer M3 constituting the third layer.

In the memory cell periphery are N- and P-channel MOSFETs making up sub word drivers SWD and other components, not shown. There is provided a first-layer metal film, not shown, which is used to constitute these peripheral circuits. For example, a metal film M1 as the first layer is used to form wires connecting the gates of N- and P-channel MOSFETs in order to constitute the above-mentioned CMOS inverter circuit. The input terminal of the CMOS inverter circuit is connected to the main word line MWB made of the second-layer metal layer M2. The layer M2 is led via through holes into the first-layer metal film M1 serving as a dummy before being connected to the gate electrode through the first layer M1 and contacts. Where the Y selection line YS formed by the third-layer metal film M3 is connected to the gate of the column selection switching MOSFET, or where the sub word line selection line FX formed by the metal layer M3 is connected to the source and drain of the P-channel MOSFET of the sub word driver, the layer M3 is led via through holes into the metal layer M2 or M1 serving as a dummy before being connected to the gate of the column switching MOSFET or to the source and drain of the P-channel MOSFET.

In the above element structure, a nonnegligible leakage current can flow through a faulty insulating film between the second-layer metal film M2 constituting the main word lines on the one hand, and another second-layer metal film M2 extending in parallel with the main word lines or the sub word selection lines made by the third-layer metal film M3 intersecting the metal layer M2 of the main word lines on the other hand. Although the leakage current in itself has no adverse effect on read or write operations on the memory cell, it can trigger current irregularities in the nonselected state. If the main word line MWB and sub word selection line FXB having the same potential are in the nonselected state in the above setup, there occurs no leakage current.

In case of a faulty read or write operation on the memory cell due to a leakage current between the main word line MWB and the sub word selection line FXB, the main word line is replaced by a spare main word line. However, the defective main word line MWB remains defective, letting the leakage current flow continuously therethrough. The incidence of such a leakage current does not affect read or write operations on the memory because the main word line MWB in question is replaced by a spare main word line. Still, the leakage current promotes a direct current increase that can deteriorate the performance of the memory product. If worst comes to worst, a DC failure can disable fault recovery circuits. Such an eventuality is circumvented by the inventive setup described above.

Figure 9A:
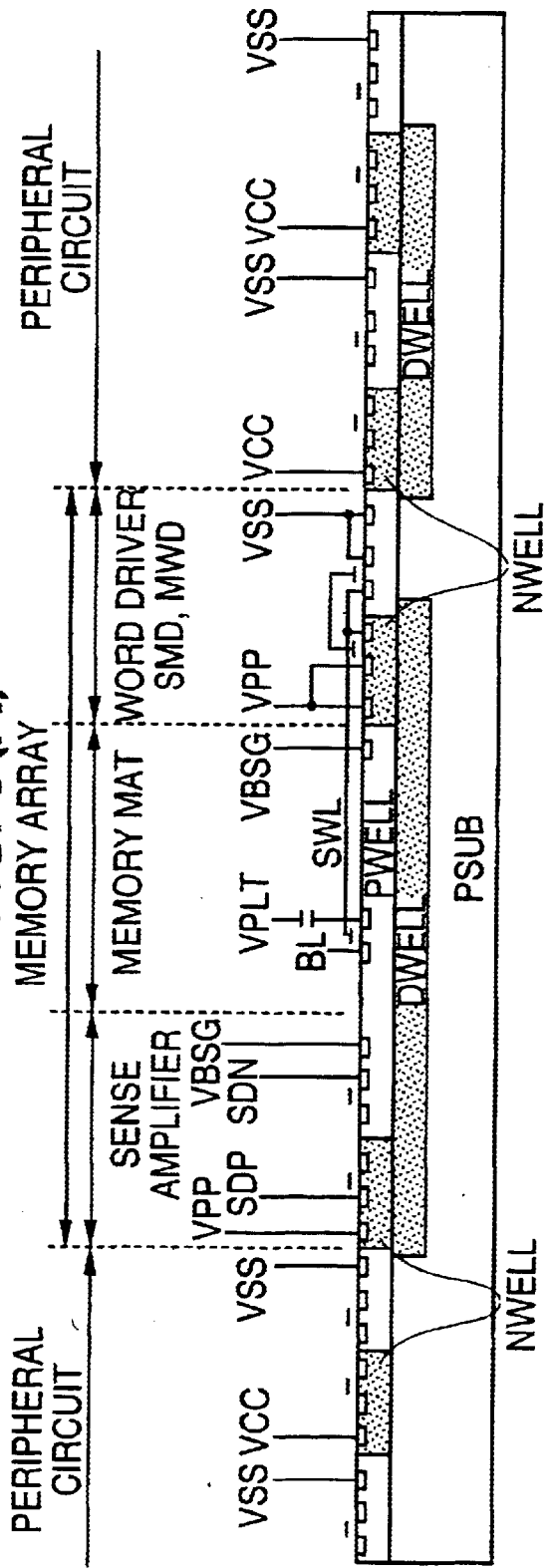
FIGS. 9(A), 9(B) and 9(C) are schematic views illustrating the inventive dynamic RAM.
Figure 9B:
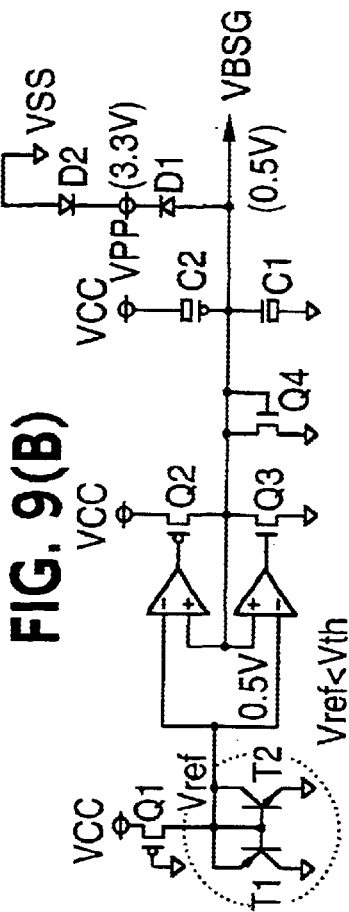
Figure 9C:
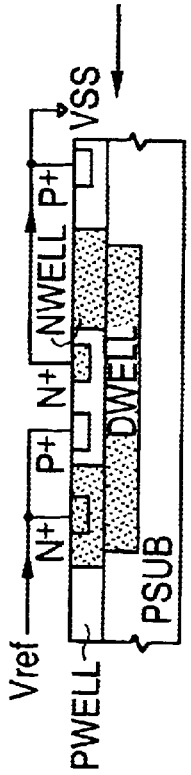

FIGS. 9(A), 9(B) and 9(C) are schematic views illustrating the inventive dynamic RAM. FIG. 9(A) shows a cross-sectional view of memory elements, FIG. 9(B) depicts a circuit diagram of a voltage generation circuit, and FIG. 9(C) indicates a cross-sectional view of elements constituting a bipolar transistor used by the voltage generation circuit. In the description that follows, similar circuit symbols repeated in different drawings are to be understood to represent not the same functions but basically different circuit facilities.

In FIG. 9(A), a P-type substrate PSUB is fed with a circuit ground potential VSS. For isolation from the substrate PSUB, deep N-type well regions DWELL are formed under P-type well regions PWELL in which to form N-channel MOSFETs constituting memory mats and sense amplifiers. N-type well regions NWELL reaching the well regions DWELL are formed in a manner surrounding the P-type well regions PWELL. The N-type well regions NWELL are used both as regions for isolating the P-type well regions PWELL and as regions in which to form P-channel MOSFETS making up word drivers and sense amplifiers. The deep N-type well regions DWELL, the P-type well regions PWELL constituting the elements, and the N-type well regions NWELL make up what is known as a triple well structure. In that structure, memory arrays formed by memory mats, sense amplifiers and word drivers (SWD, MWD) are laid out efficiently. The P-type well regions PWELL isolated by the regions DWELL below and by the surrounding regions NWELL are supplied not with a negative back bias voltage such as one of a conventional dynamic RAM but with a diode forward voltage of about +0.5 V or a bias voltage VBSG lower than the forward voltage. The regions NWELL (DWELL) furnished to isolate electrically the P-type well regions PWELL are fed with a boosted voltage VPP corresponding to the selected level of the sub word line SWL.

The N-channel MOSFETs making up the word drivers are formed in the P-type well regions PWELL which also include ohmic contact regions for feeding the substrate PSUB with the circuit ground potential VSS. The N-channel MOSFETs constituting the peripheral circuits are divided into two groups: those formed in the P-type well regions PWELL on the substrate PSUB, and those in the P-type well regions PWELL formed above the regions DWELL for electrical isolation from the substrate PSUB. In the setup of FIG. 9(A), all P-type well regions PWELL are supplied with the circuit ground potential VSS. Alternatively, the P-type well regions PWELL formed above the regions DWELL may be fed with the voltage VBSG as needed because they are isolated electrically like memory arrays.

FIG. 9(B) shows a voltage generation circuit that generates the bias voltage VBSG. As illustrated in FIG. 9(C), the regions PWELL isolated by the regions DWELL and NWELL have P+ and N+ diffusion layers formed therein. The N+ diffusion layer is used as an emitter and connected to the circuit ground potential VSS. With the regions PWELL used as a base, the P+ diffusion layer is connected to the N+ diffusion layer which is used as a collector and which is formed in the regions NWELL, whereby a transistor T2 is formed. A PNP transistor T1 is a parasitic transistor constituted by the regions PWELL and DWELL as well:as by the-substrate PSUB.

The transistor T2 is fed with a bias current from a P-channel MOSFET Q1. This causes a reference voltage Vref of about 0.5 V to be generated between the base and the emitter of the transistor T2. A voltage comparator compares the voltage Vref with the output voltage VBSG. A P-channel MOSFET Q2 and an N-channel MOSFET Q3 are controlled in operation in such a manner that the voltage VBSG equals the reference voltage Vref upon comparison. An output portion of the voltage generation circuit is provided with an N-channel MOSFET Q4 of diode type. The threshold voltage of the MOSFET Q4 is used as a basis for setting the output voltage VBSG to about 0.5 V. Illustratively, when a relatively large current flows in as a result of a sense amplifier operation, the voltage clamping effect of the threshold voltage of the MOSFET Q4 is used to prevent a rise in the voltage VBSG.

The output portion is furnished with capacitors C1 and C2 to stabilize the output voltage VBSG. A diode D1 is a parasitic diode formed by PN junction between regions PWELL and NWELL (DWELL), and a diode D2 is a PN junction diode between a region DWELL and the substrate PSUB. The PN junction capacities of these diodes D1 and D2 may also be utilized in stabilizing the output voltage VBSG.

Figure 10A:
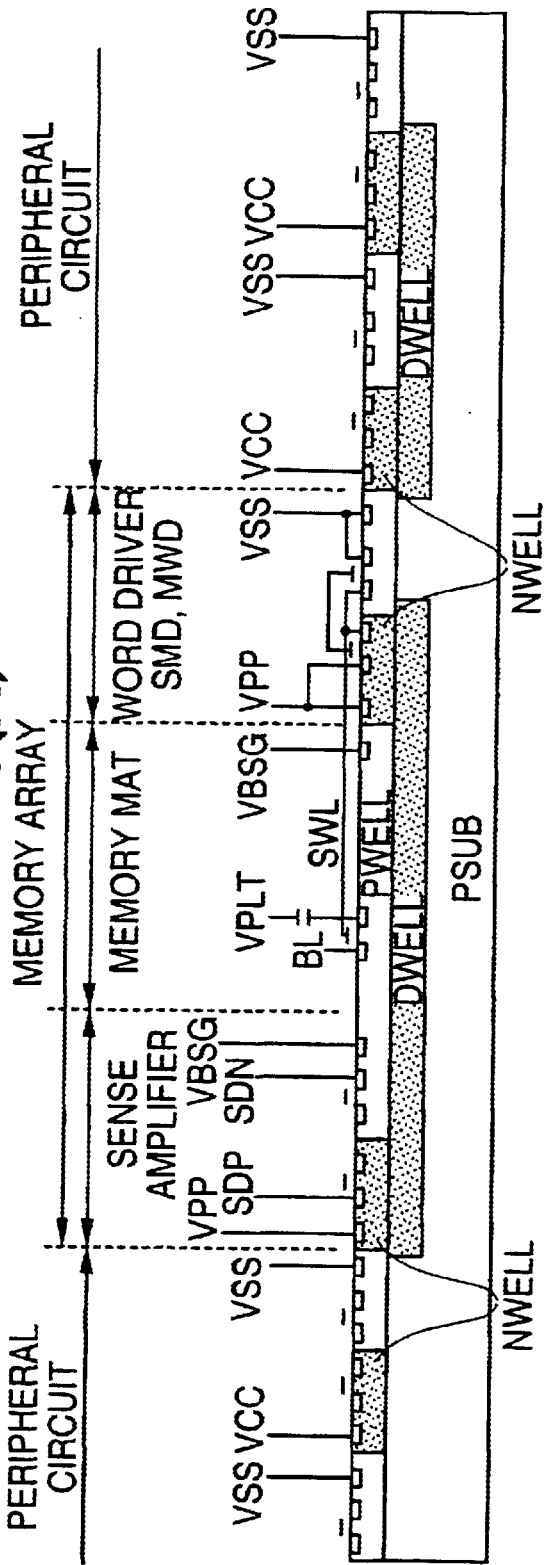
FIGS. 10(A), 10(B) and 10(C) are schematic views showing another dynamic RAM embodying the invention.
Figure 10B:
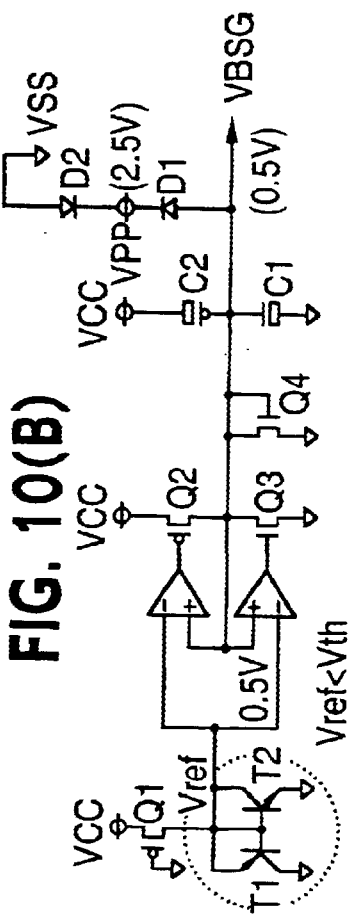
Figure 10C:
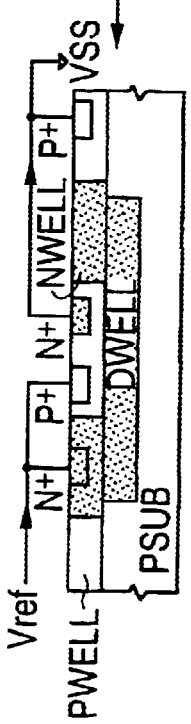

FIGS. 10(A), 10(B) and 10(C) are schematic views showing another dynamic RAM embodying the invention. As with FIGS. 9(A) through 9(C), FIG. 10(A) shows a cross-sectional view of memory elements, FIG. 10(B) depicts a circuit diagram of a voltage generation circuit, and FIG. 10(C) indicates a cross-sectional view of elements constituting a bipolar transistor used by the voltage generation circuit. In this embodiment, N-type well regions NWELL and DWELL of memory arrays are fed with the supply voltage VCC. The rest of the constitution is the same as that of the embodiment in FIGS. 9(A) through 9(C). In the embodiment of FIGS. 10(A) through 10(C), word drivers (SWD) are constituted by bootstrap circuits that generate a boosted voltage providing the selected level of the word line SWL.

If the supply voltage VCC is used in the same manner as in this embodiment, the same supply voltage VCC as that fed to the deep N-type well regions DWELL is supplied to N-type well regions NWELL in which to form p-channel MOSFETs making up sense amplifiers and word drivers. Because the back bias voltage such as that of the embodiment in FIGS. 9(A) through 9(C) is not provided, the threshold voltage of the MOSFETs may be reduced. With larger currents allowed to flow in the on-state, the speed of transistor operations can be enhanced. The stabilizing capacitor C2 may be omitted because the output portion is supplemented by a relatively large parasitic capacity between the regions PWELL and DWELL.

Figure 11A:
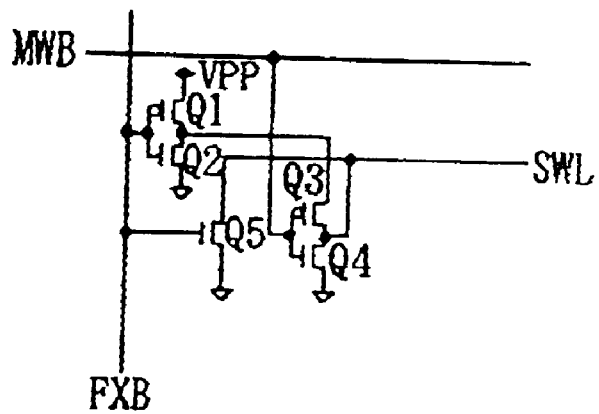
FIGS. 11(a), 11(b) and 11(c) are schematic and graphic representations depicting sub word drivers used by the inventive dynamic RAM.
Figure 11B:
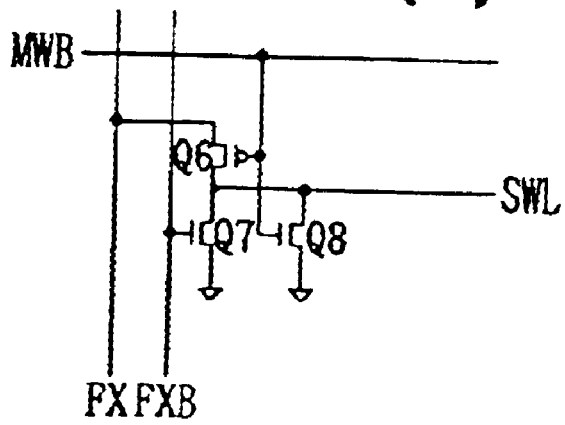
Figure 11C:
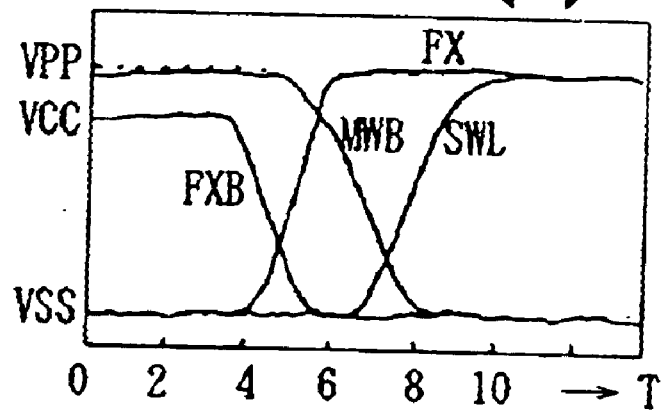

FIGS. 11(a), 11(b) and 11(c) are schematic and graphic representations depicting sub word drivers used by the inventive dynamic RAM. FIG. 11(a) shows a sub word driver of the CMOS type. As in the previous embodiments, the sub word driver brings Low the main word line MWB and sub word line selection line FXB in the nonselected state and drives the lines High in the selected state, thereby preventing the incidence of leakage currents mentioned above. In the sub word driver, a sub word line selection signal FX is generated by a CMOS inverter circuit made of a P-channel MOSFET Q1 and an N-channel MOSFET Q2 operating on the boosted voltage VPP. The sub word line selection signal FX thus generated is used to provide an operating voltage for a sub word driver constituted by a P-channel MOSFET Q3 and an N-channel MOSFET Q4.

The sub word line selection line FXB is also fed to the gate of an N-channel MOSFET Q5 for resetting the sub word line SWL. With the main word line MWB brought Low in the selected state and with the sub word selection line FXB driven High in the nonselected state, the MOSFET Q5 is turned on to bring the sub word line SWL to a nonselected level such as the circuit ground potential VSS.

FIG. 11(b) shows another typical sub word driver of the CMOS type. In this example, the sub word line selection lines carry complementary signals FX and FXB in order to reduce sub word driver circuit elements. As depicted in FIG. 11(c), the signals FX and MWB plot a high amplitude of VPP-VSS, while the sub word selection line FXB manifests a low amplitude such as VCC-VSS.

When the main word line MWB is driven Low, a P-channel MOSFET Q6 is turned on to transmit the selected level VPP of the sub word selection line FX to the sub word line SWL. In another level combination, i.e., where the main word line MWB is brought Low in the selected state, an N-channel MOSFET Q7 is turned on to set the sub word line SWL to the nonselected level such as the circuit ground potential VSS provided the sub word selection line FX is Low and FXB is High. Conversely, where the sub word selection line FX is at the selected level such as VPP, the P-channel MOSFET Q6 is turned off and an N-channel MOSFET Q8 is turned on to set the sub word line SWL to the nonselected level such as the circuit ground potential VSS provided the main word line MWB is at the nonselected state such as the High level (VPP).

FIGS. 12(a), 12(b), 12(c) and 12(d) are schematic and graphic representations sketching other sub word drivers. A sub word driver in FIG. 12(a) has switching MOSFETs Q1 and Q2 interposed between a main word line MWL, a sub word selection line FX, and a sub word line SWL. A signal coming from each switching transistor executes switching control over the other switching transistor. When the main word line MWL and subword selection line FX are brought High at the selected level, the sub word line SWL is driven High in keeping with that selected level. In order to boost the selected level of the sub word line SWL up to the VPP level, the selection signal of the sub word line SWL is delayed by CMOS inverter circuits N2 and N3 thus driving a bootstrap capacity CB. That is, driving the sub word line SWL High charges the bootstrap capacity CB. A raised delay signal past the inverter circuits N2 and N3 drives the bootstrap capacity CB to boost the voltage level on the sub word line SWL.

Figure 12A:
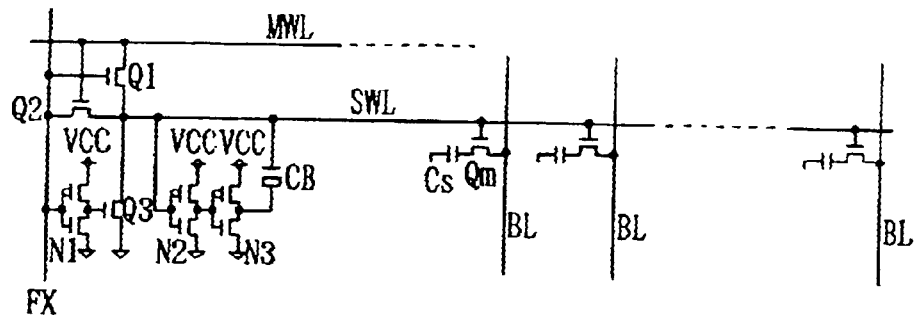
FIGS. 12(a), 12(b), 12(c) and 12(d) are schematic and graphic representations illustrating other sub word drivers used by the inventive dynamic RAM.

An MOSFET Q3 is interposed between the sub word line SWL and circuit ground potential VSS. When the sub word line selection line FX is brought Low at the nonselected level, a CMOS inverter circuit N1 receiving the Low level from the line FX outputs a High level output signal that turns on the MOSFET Q3. That in turn fixes the sub word line SWL to the nonselected level such as the circuit ground potential VSS. FIG. 12(a) additionally depicts memory cells each interposed between the sub word line SWL and a bit line BL intersecting the line SWL. In FIG. 12(a), paired bit lines BLB are omitted.

Figure 12B:
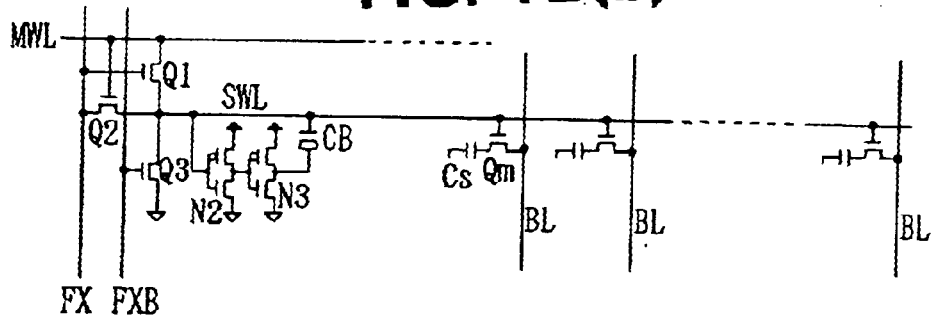
Figure 12C:
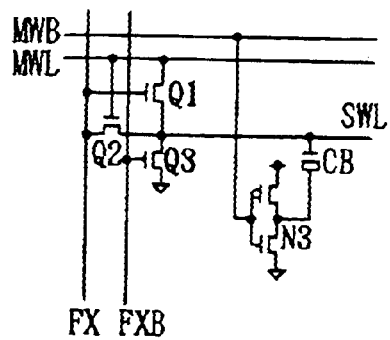
Figure 12D:
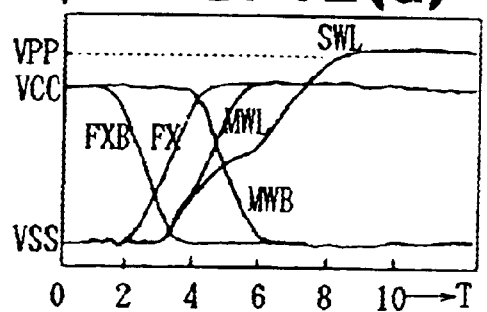

A sub word driver in FIG. 12(b) is a variation of the setup of FIG. 12(a) in which the CMOS inverter circuit N1 is omitted and a sub word selection line FXB is added. The sub word selection line FXB is connected to the gate of the MOSFET Q3. When the sub word line selection line FX is brought Low at the nonselected level, the sub word selection line FXB is driven High. This turns on the MOSFET Q3 to fix the sub word line SWL to the nonselected level such as the circuit ground potential VSS. In this sub word driver, the number of elements is reduced but the sub word selection line FXB is added. A sub word driver in FIG. 12(c) is a variation of the setup of FIG. 12(b) in which the CMOS inverter circuit N2 is omitted and a main word line MWB is added. The main word line MWB carries a signal level opposite in phase to that of the main word line MWL. As will be understood from signal waveforms in FIG. 12(d), driving both the sub word line FX and the main word line MWL High turns on the MOSFETs Q1 and Q2. With the main word line MWL and sub word selection line FX at the selected level, the sub word line SWL is driven High. That in turn charges the bootstrap capacity CB. Upon receipt of the Low level from the main word line MWB, the inverter circuit N3 outputs a High level output signal driving the bootstrap capacity CB. This raises the selected level of the sub word line SWL to the boosted voltage VPP.

In these examples, the sub word selection lines FX and FXB as well as the main word lines MWL and MWB have low amplitude signal levels such as VCC-VSS. Thus as shown in the makeup of FIGS. 10(A) through 10(C), the example of FIG. 12(c) causes the bias voltage fed to the regions NWELL and DWELL of the memory array to become as low as the supply voltage VCC. That in turn lowers the threshold voltage for the P-channel MOSFETs constituting sense amplifiers and word drivers in these regions, whereby the speed of sense amplifier and word driver operations is boosted.

FIGS. 13(a), 13(b), 13(c), 13(d), 13(e) and 13(f) are schematic and graphic representations showing other sub word drivers used by the inventive dynamic RAM. These sub word drivers are designed to have a negative voltage VBB as their nonselected level. With the address selection MOSFET Qm of any memory cell turned off, the negative voltage VBB allows the gate voltage to be backward-biased more deeply than the source voltage. This reduces a sub threshold leakage current between the source and the drain, which prolongs the time period in which to retain data.

Figure 13A:
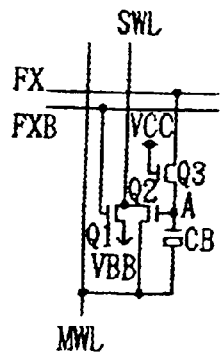
FIGS. 13(a), 13(b), 13(c), 13(d), 13(e) and 13(f) are schematic and graphic representations showing still other sub word drivers used by the inventive dynamic RAM.

The sub word driver in FIG. 13(a) comprises a main word line MWL and sub word selection lines FX and FXB. The sub word selection line FXB is used to control an MOSFET Q1. That is, when the sub word selection line FXB is driven High in the nonselected state, the MOSFET Q1 is turned on to set the sub word line SWL to a negative voltage such as VBB. When the sub word selection line FX is brought High in the selected state and the main word line MWL is in the nonselected state, an MOSFET Q2 is turned on through an MOSFET Q3 to transmit the nonselected potential VBB of the main word line MWL to the sub word line SWL.

Figure 13B:
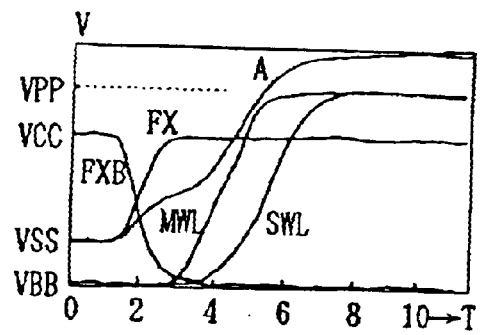

The sub word line SWL is selected as follows: as indicated by operation waveforms in FIG. 13(b), the sub word selection line FXB is first set to the negative voltage VBB, the line FX is brought to the High level such as that of the supply voltage VCC, and the bootstrap capacity CB is charged through the MOSFET Q3. Thereafter, driving the main word line MWL High raises the potential of a node A of the capacity CB. This allows the selected level (VPP) of the main word line MWL to be transmitted unmodified to the sub word line SWL through the MOSFET Q2. The MOSFET Q3 works as a cut MOSFET. That is, making the potential of the node A higher than the supply voltage VCC reverses the levels of the source and drain to bring about an off-state. This allows the node A to retain the boosted voltage without a reverse flow being effected to the supply voltage side VCC.

Figure 13C:
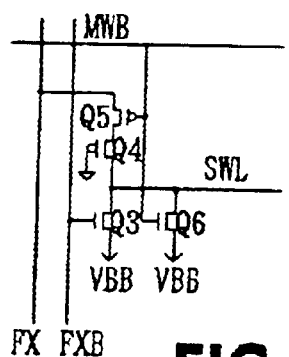

The sub word driver in FIG. 13(c) comprises the main word line MWB and sub word selection lines FX and FXB. The sub word selection line FXB is used to control the MOSFET Q3. That is, when the sub word selection line FXB is driven High in the nonselected state, the MOSFET Q3 is turned on to set the sub word line SWL to a negative voltage such as VBB. When the sub word selection line FX is brought High in the selected state and the main word line MWB is High in the nonselected state, an MOSFET Q6 is turned on to transmit the negative voltage VBB to the sub word line SWL.

Figure 13D:
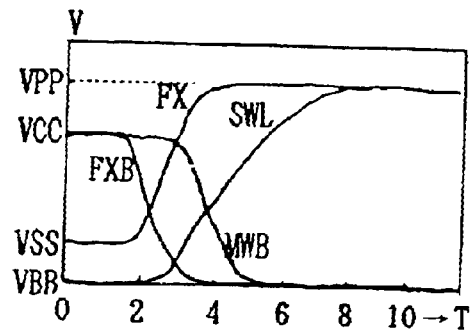

The sub word line SWL is selected as follows: as indicated by operation waveforms in FIG. 13(d), the sub word selection line FXB is first set to the negative voltage VBB to turn off the MOSFET Q3, with the main word line MWB driven Low to turn on a P-channel MOSFET Q5. This allows the High level such as that of the boosted voltage VPP on the sub word selection line FX to be transmitted to the sub word line SWL through the MOSFETs Q4 and Q5.

Figure 13E:
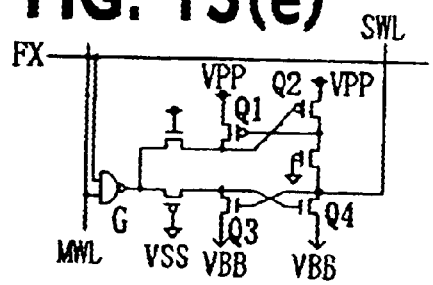
Figure 13F:
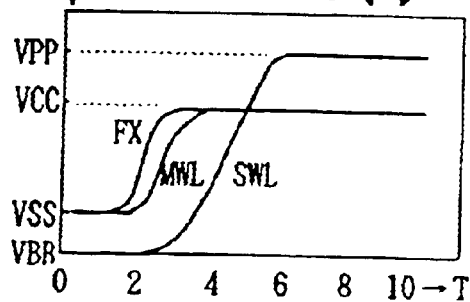

The sub word driver in FIG. 13(e) has a level conversion feature. A level conversion circuit is constituted by a NAND gate circuit G that receives signals from a main word line MWL and a sub word selection line FX, and by P-channel MOSFETs Q1 and Q2 as well as N-channel MOSFETs Q3 and Q4 for latching an output signal from the NAND gate circuit G. This setup subjects a signal amplitude such as VCC-VSS to level conversion into an amplitude such as VPP-VBB. The output signal of the gate circuit G is sent to the level conversion circuit via a P-channel cut MOSFET in order to prevent a back flow of a level conversion signal to the gate circuit G. Between the output MOSFETs Q2 and Q4 is a P-channel MOSFET connected in series for protection against dielectric breakdown. Where the negative voltage VBB is used as the nonselected level of a sub word line as in this example, a bias voltage such as VBB is supplied to regions PWELL in which to form N-channel MOSFETs constituting sub word drivers, as will be described later with reference to FIG. 20.

Figure 14:
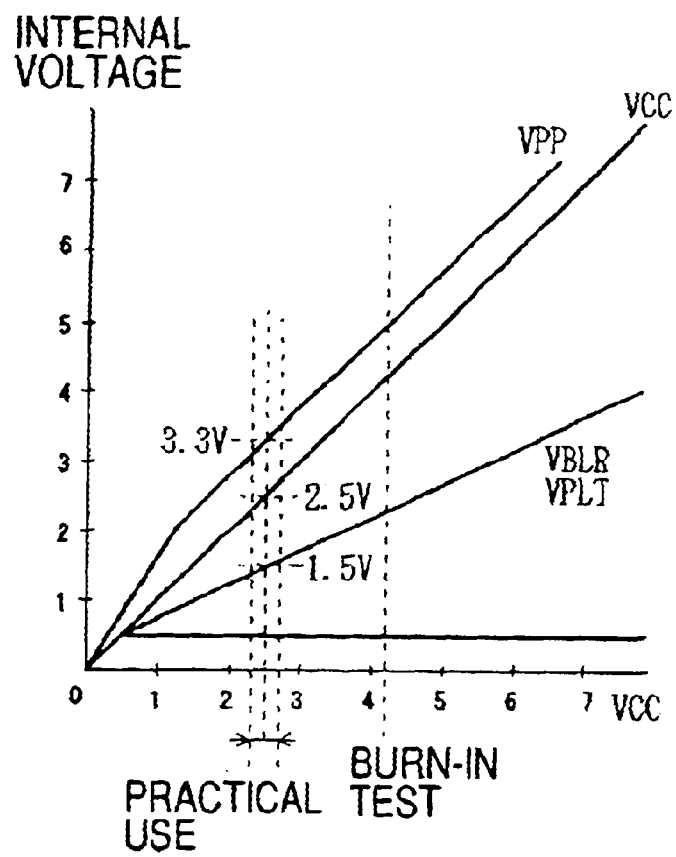
FIG. 14 is a graphic representation of voltage characteristics manifested by the inventive dynamic RAM.

FIG. 14 is a graphic representation of voltage characteristics manifested by the inventive dynamic RAM. Given the supply voltage VCC, an internal booster circuit generates a boosted voltage VPP corresponding to the selected level of a word line. The supply voltage VCC is set for about 2.5 V in actual use. The threshold voltage of the address selection MOSFET Qm in a memory cell is lowered to about 0.8 V even when the substrate effect applicable with the source potential set for the supply voltage VCC is taken into consideration. This allows the boosted voltage VPP to be as low as 3.3 V.

Illustratively, when the film pressure (tox) of a gate oxide film in MOSFETs is 8 mn, the maximum allowable field intensity of the gate oxide film is about 4 to 4.5 MV/cm. Thus if the boosted voltage VPP is held at 3.3 V as described above, necessary margins are made available for dealing with the allowable field intensity. The supply voltage VCC is divided (VCC/2) into a bit line precharging voltage VBLR (HVC) and a plate voltage VPLT. If the supply voltage VCC is raised to 4 V or higher, a burn-in test region is reached wherein the voltage VPP goes up in keeping with the supply voltage VCC. This allows burn-in tests to be carried out.

The bias voltage VBSG fed to regions PWELL of the memory array is set stably for about 0.5 V corresponding to the forward voltage of diodes (diode-connected transistors) as described above. The voltage VBSG also serves as an operating voltage (reference voltage) on the Low level side of sense and write amplifiers. As such, the voltage VBSG is held constant regardless of changes in the supply voltage VCC.

Figure 15:
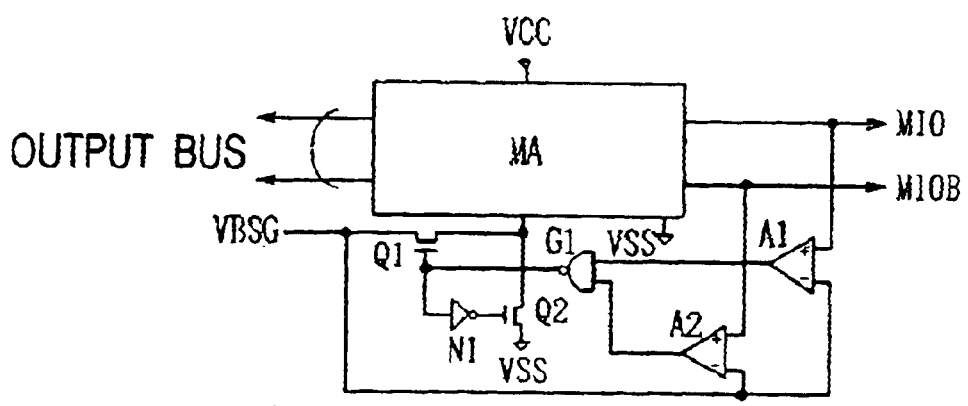
FIG. 15 is a circuit diagram of a main amplifier MA used by the inventive dynamic RAM.

FIG. 15 is a circuit diagram of a main amplifier MA used by the inventive dynamic RAM. The main amplifier MA acts as a buffer amplifier. Between an output bus on the one hand and main I/O lines MIO and MIOB on the other hand, the main amplifier MA serves as a bidirectional buffer. Where the signal level on the memory array side is VCC-VBSG as in the setup above, the main amplifier MA has arrangements to prevent Low level signals of the main I/O lines MIO and MIOB from dropping below the voltage VBSG.

A switching MOSFET Q2 is interposed between a Low level side operating voltage terminal of the main amplifier MA on the one hand and the ground potential VSS on the other hand. A switching MOSFET Q1 is interposed between that operating voltage terminal and the internal voltage VBSG. The signals of the main I/O lines MIO and MIOB are fed respectively to voltage comparators A1 and A2 at their non-inverted input terminals (+). The inverted input terminals (−) of the voltage comparators A1 and A2 are supplied with the internal voltage VBSG.

The main amplifier MA starts its amplifying operation in keeping with an operation timing signal, now shown. If the levels of the main I/O lines MIO and MIOB are higher than the internal voltage VBSG, the output signals of the voltage comparators A1 and A2 are brought High and the output signal of a NAND gate G1 is driven Low. This brings High the output signal of an inverter circuit N1, thus turning on the MOSFET Q2. That is, the main amplifier MA starts its amplifying operation by use of the circuit ground potential VSS.

When the Low level potential of one of the main I/O lines MIO and MIOB reaches the voltage VBSG through the amplifying operation above, the output signal of the voltage comparator A1 or A2 is driven Low. This turns on the switching MOSFET Q1 and turns off the MOSFET Q2. That is, until the Low level potential of one of the main I/O lines MIO and MIOB reaches the voltage VBSG during amplification, the voltage VSS lower than the voltage VBSG is used for operation. This constitutes what is known as an overdrive that boosts the speed of amplifier operation.

Figure 16:
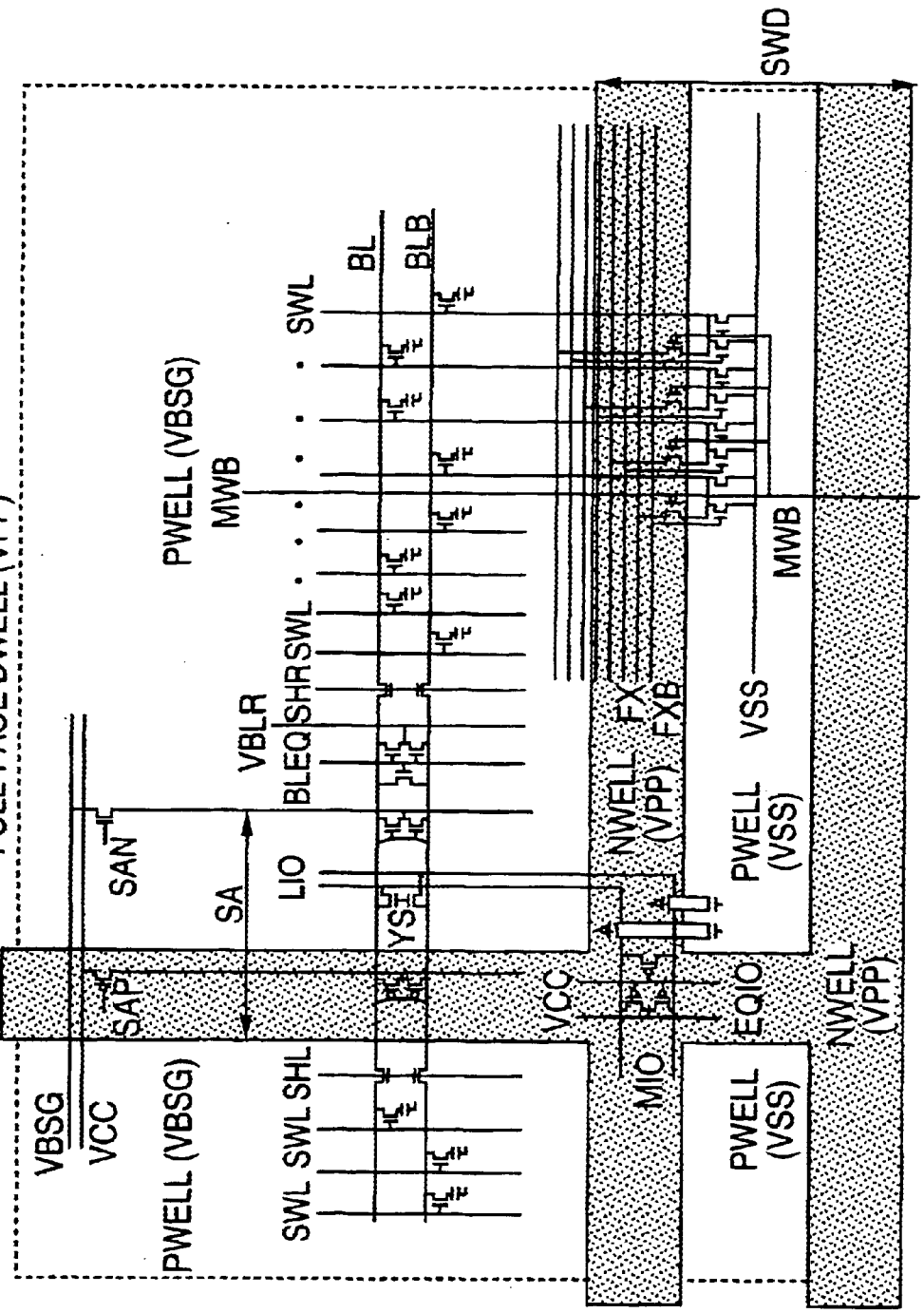
FIG. 16 is a schematic circuit diagram of a dynamic RAM embodying the invention.

FIG. 16 is a schematic view of a dynamic RAM embodying the invention. FIG. 16 shows in a circuit diagram a layout pattern of well regions and elements (MOSFETs) formed therein. The makeup of FIG. 16 corresponds to that of the cross-sectional views in FIGS. 9(A) and 9(C). Specifically, N-type well regions DWELL are formed deep in the entire substrate. White areas in the well regions DWELL constitute P-type well regions PWELL. The memory mat is fed with the voltage VBSG, and the P-type well regions PWELL in a word driver SWD are supplied with the circuit ground potential VSS. Crosshatched areas make up N-type well regions NWELL to which the boosted voltage corresponding to the selected level of the word line is supplied.

In the regions PWELL of the memory mat, memory cells are located at points of intersection between pair bit lines BL and BLB on the one hand and sub word lines SWL on the other hand. The pair bit lines BL and BLB are furnished with shared switching MOSFETs controlled in switching action by a control signal SHR; with an equalizing (precharging) circuit controlled in switching action by an equalizing signal BLEQ to set the pair bit lines BL and BLB for a precharging voltage VBLR; with N-channel amplification MOSFETs constituting a sense amplifier; with column switching MOSFETs controlled in switching action by a column selection signal YS; and with power switching MOSFETs supplying the voltage VBSG to the N-channel amplification MOSFETs in response to a sense amplifier activation signal SAN. The regions PWELL in the memory mat are divided by the regions NWELL in the extending direction of the bit lines BL and BLB. In the regions NWELL, there are formed P-channel MOSFETs constituting the sense amplifier and power switching MOSFETs feeding the supply voltage VCC to the P-channel amplification MOSFETs. In this makeup, the bit lines BL and BLB are split and located on the right-and the left-hand side of the sense amplifier in what is know as the shared sense amplifier arrangement.

In the regions NWELL and PWELL laid out in a manner splitting the memory mat portion in the extending direction of the word lines SWL, there are formed P- and N-channel MOSFETs constituting a sub word driver SWD. The crosshatched areas of the regions NWELL comprise CMOS switches each made of a P-and an N-channel MOSFET connecting a local I/O line LIO to the main I/O line MIO. The main I/O line MIO is furnished with an equalizing circuit constituted by P-channel MOSFETs included in the crosshatched areas of the regions NWELL.

Figure 17:
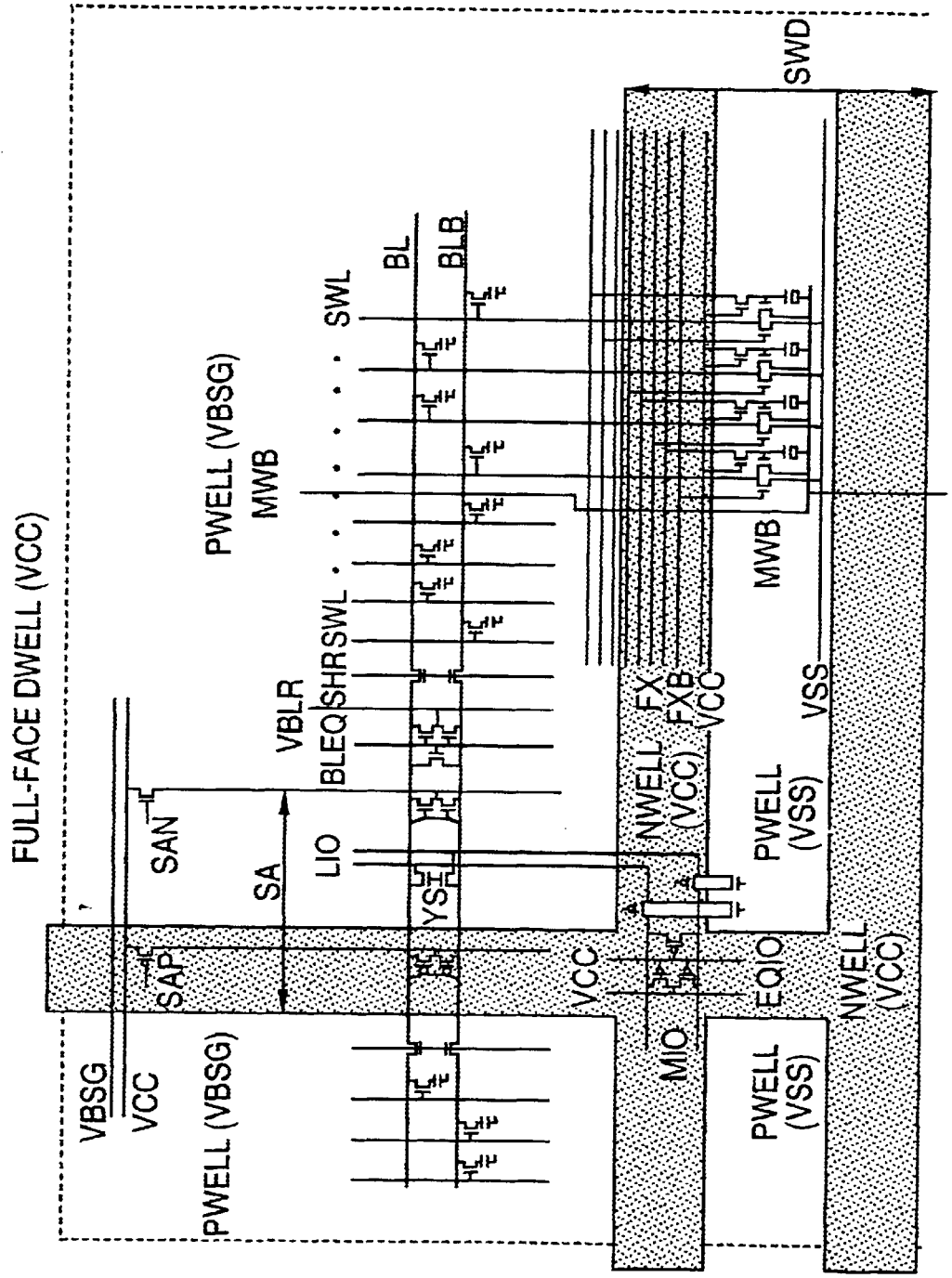
FIG. 17 is a schematic circuit diagram of another dynamic RAM embodying the invention.

FIG. 17 is a schematic view of another dynamic RAM embodying the invention. FIG. 17 shows in a circuit diagram a layout pattern of well regions and elements (MOSFETs) formed therein. The makeup of FIG. 17 corresponds to that of the cross-sectional views in FIGS. 10(A) and 10(C). Specifically, N-type well regions DWELL are formed deep in the entire substrate. White areas in the well regions DWELL constitute P-type well regions PWELL. The memory mat is fed with the voltage VBSG, and the P-type well regions PWELL in a word driver SWD are supplied with the circuit ground potential VSS. Crosshatched areas make up N-type well regions NWELL to which the supply voltage VCC is fed.

The makeup of FIG. 17 is similar to that of FIG. 16 except that the regions NWELL are fed with the supply voltage VCC. That means the P-channel MOSFETs formed in the regions NWELL are not provided with a back bias voltage as was the case when the boosted voltage VPP was supplied. It follows that the effective threshold voltage for the P-channel MOSFETs is made lower than before. Turning on the P-channel MOSFETs causes a larger current to flow, which boosts the speed of sense amplifier operation. The sub word driver is made small in size because it is constituted illustratively by N-channel MOSFETs such as those shown in FIG. 13(a) so that the regions NWELL accommodate the sub word selection lines FX and FXB and wiring of the supply voltage VCC only.

FIGS. 18(A) and 18(B) are cross-sectional views of elements constituting another dynamic RAM embodying the invention. In FIG. 18(A), a P-type substrate PSUB is supplied with the voltage VBSG. Feeding the voltage VBSG to the substrate PSUB provides the stabilizing capacitor C2 in FIG. 10(B) with an increased capacity. Because a PN junction capacity between the regions DWELL on the one hand and the substrate PSUB on the other hand may be utilized as the stabilizing capacitor C2, the voltage VBSG is better stabilized than before. In P-type well regions PWELL, there are formed N-channel MOSFETs making up word drivers SWD and MWD as well as peripheral circuits. Isolated by the regions DWELL and NWELL, the P-type well regions PWELL is fed with the circuit ground potential VSS.

In a memory array of FIG. 18(B), the regions NWELL separate the regions PWELL into two kinds: those where N-channel MOSFETs of sense amplifiers are formed, and those in which the memory cells are formed. In this structure, the regions PWELL in which to form the N-channel MOSFETs constituting the sense amplifiers is supplied with the circuit ground potential VSS or with the voltage VBSG. Because the N-channel MOSFETs of the sense amplifiers are electrically isolated from the memory cells, this structure protects the memory cells in terms of data retention capability against adverse effects of minority carriers generated upon sense amplifier operation. The rest of the structure is the same as that of FIG. 18(A).

FIGS. 19(A) and 19(B) are cross-sectional views of elements constituting another dynamic RAM embodying the invention. In FIG. 19(A) as in FIG. 18(A), a P-type substrate PSUB is supplied with the voltage VBSG. Where the substrate PSUB is fed with the voltage VBSG, there is no sense in electrically separating the regions PWELL of the memory mats from the substrate PSUB. For that reason, no DWELL regions are formed in low layers of the memory mats. In such a case, the stabilizing capacitor C2 may also be provided with an enhanced capacity.

In a memory array of FIG. 19(B), the regions NWELL also separate the regions PWELL into two kinds: those where N-channel MOSFETs of sense amplifiers are formed, and those in which the memory cells are formed. In this structure, the regions PWELL in which to form the N-channel MOSFETs constituting the sense amplifiers is supplied with the circuit ground potential VSS or with the voltage VBSG. Because the N-channel MOSFETs of the sense amplifiers are electrically isolated from the memory cells, this structure protects the memory cells in terms of data retention capability against adverse effects of minority carriers generated upon sense amplifier operation. The rest of the structure is the same as that of FIG. 19(A).

Figure 20:
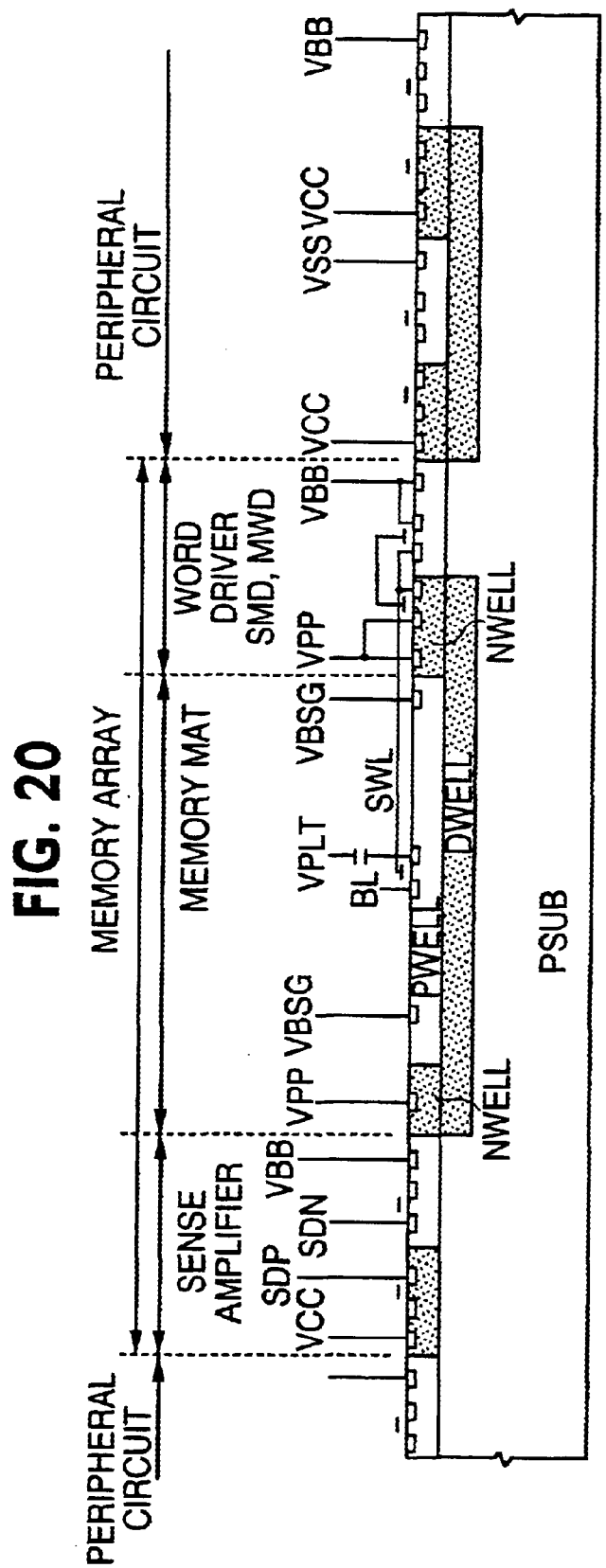
FIG. 20 is across-sectional view of elements constituting another dynamic RAM embodying the invention.

FIG. 20 is a cross-sectional view of elements constituting another dynamic RAM embodying the invention. In FIG. 20, a P-type substrate PSUB is supplied with a negative voltage VBB. The voltage VBB is illustratively set for about −0.5 V. This embodiment sets the Low level operating voltage of sense amplifiers for the circuit ground potential VSS in order to alleviate loads of the voltage VBSG. In such a case, the potential on the bit line BL or BLB is set for ground potential such as 0 V that is written to capacitors Cs of the memory cells. Thus if the threshold voltage of the address selection MOSFETs of the memory cells is lowered as in the previous case, the nonselected level of the word line SWL is set not for 0 V but for the negative voltage VBB of, say, −0.5 V in order to apply a backward bias voltage between the source and the gate.

Figure 21:
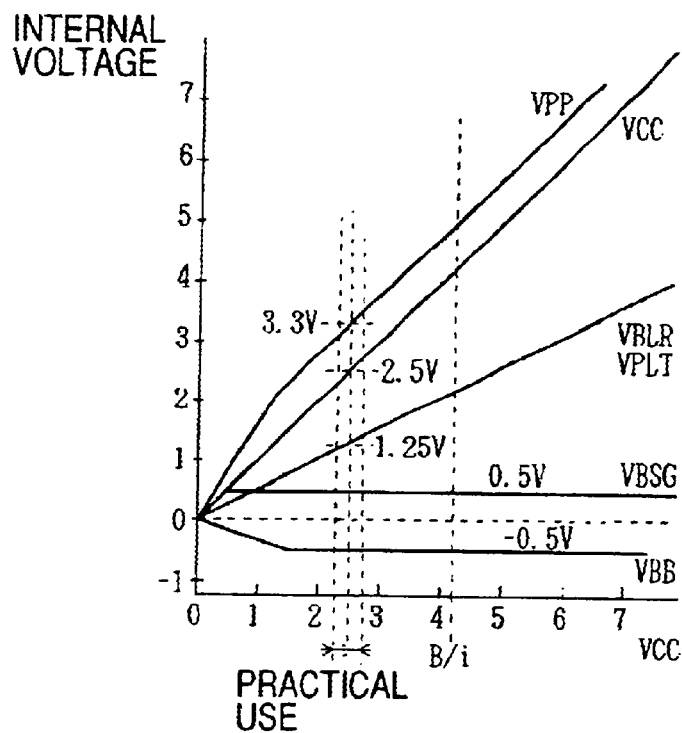
FIG. 21 is a graphic representation of voltage characteristics manifested by the dynamic RAM of FIG. 20.

FIG. 21 is a graphic representation of voltage characteristics manifested by the dynamic RAM of FIG. 20. Given the supply voltage VCC, an internal booster circuit generates a boosted voltage VPP corresponding to the selected level of a word line. A voltage generation circuit of the above-mentioned type uses the supply voltage VCC in generating a voltage VBSG. Given the voltage VBSG, a charge pump circuit generates a negative voltage VBB. The supply voltage VCC for actual use is set for about 2.5 V. In order to set in that makeup the threshold voltage of the address selection MOSFET Qm of the memory cell for about 0.8 V, the nonselected level of the word line to which the memory cell is connected is set for the above-mentioned negative voltage VBB (−0.5 V). The supply voltage VCC is divided (VCC/2) into a bit line precharging voltage VBLR (HVC) and a plate voltage VPLT. If the supply voltage VCC is raised to 4 V or higher, a burn-in test (Bi) region is reached wherein the voltage VPP goes up in keeping with the supply voltage VCC. This allows burn-in tests to be carried out.

Figure 22:
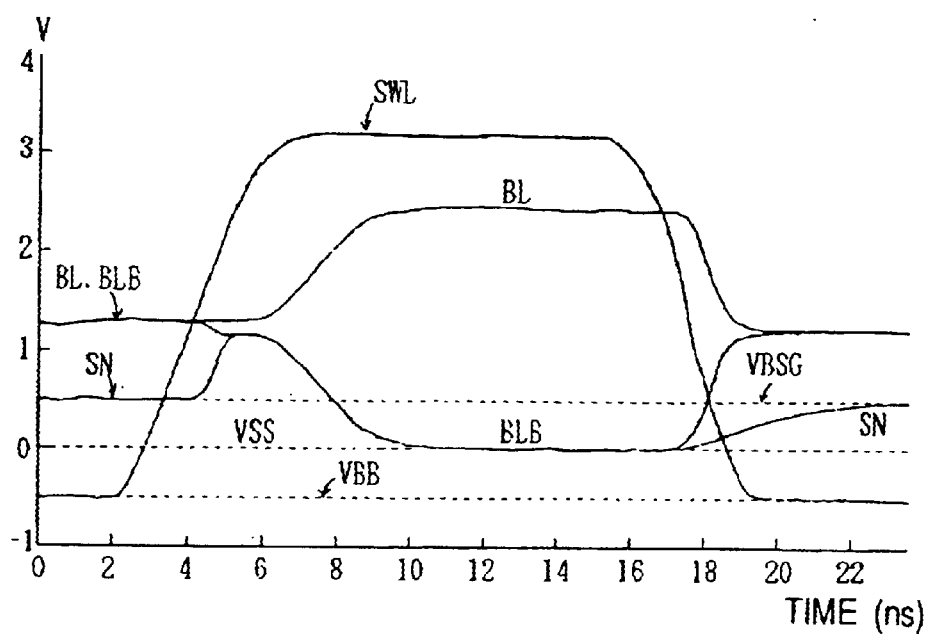
FIG. 22 is an operation waveform chart applicable to the dynamic RAM of FIG. 20.

FIG. 22 is an operation waveform chart applicable to the dynamic RAM of FIG. 20. In its nonselected state, a sub word line SWL is set for a negative voltage VBB of, say, −0.5 V. When the sub word line SWL is brought to the selected level such as VPP, there occurs between bit lines BL and BLB a potential difference corresponding to the stored charge of a memory cell. When a sense amplifier is activated, the bit lines BL and BLB have their potential difference increased such as is the case between VCC and VSS. This brings the capacitor of the memory cell to its initial charged state.

The sub word line SWL is brought from the voltage VCC to the nonselected level such as VBB. In that case, if a voltage of 0 V is written to the capacitor Cs, any sub threshold leakage current is reduced because the potential of the sub word line SWL is set for the negative voltage VBB with respect to the source potential of the address selection MOSFET. The regions PWELL in which to form the memory cells are supplied with a voltage VBSG of, say, +0.5 V. This means that a forward bias voltage occurs between the drain and source of the address selection MOSFET on the one hand and the substrate on the other hand. Over time, the potential of the storage node SN of the capacitor rises to VBSG.

Figure 23:
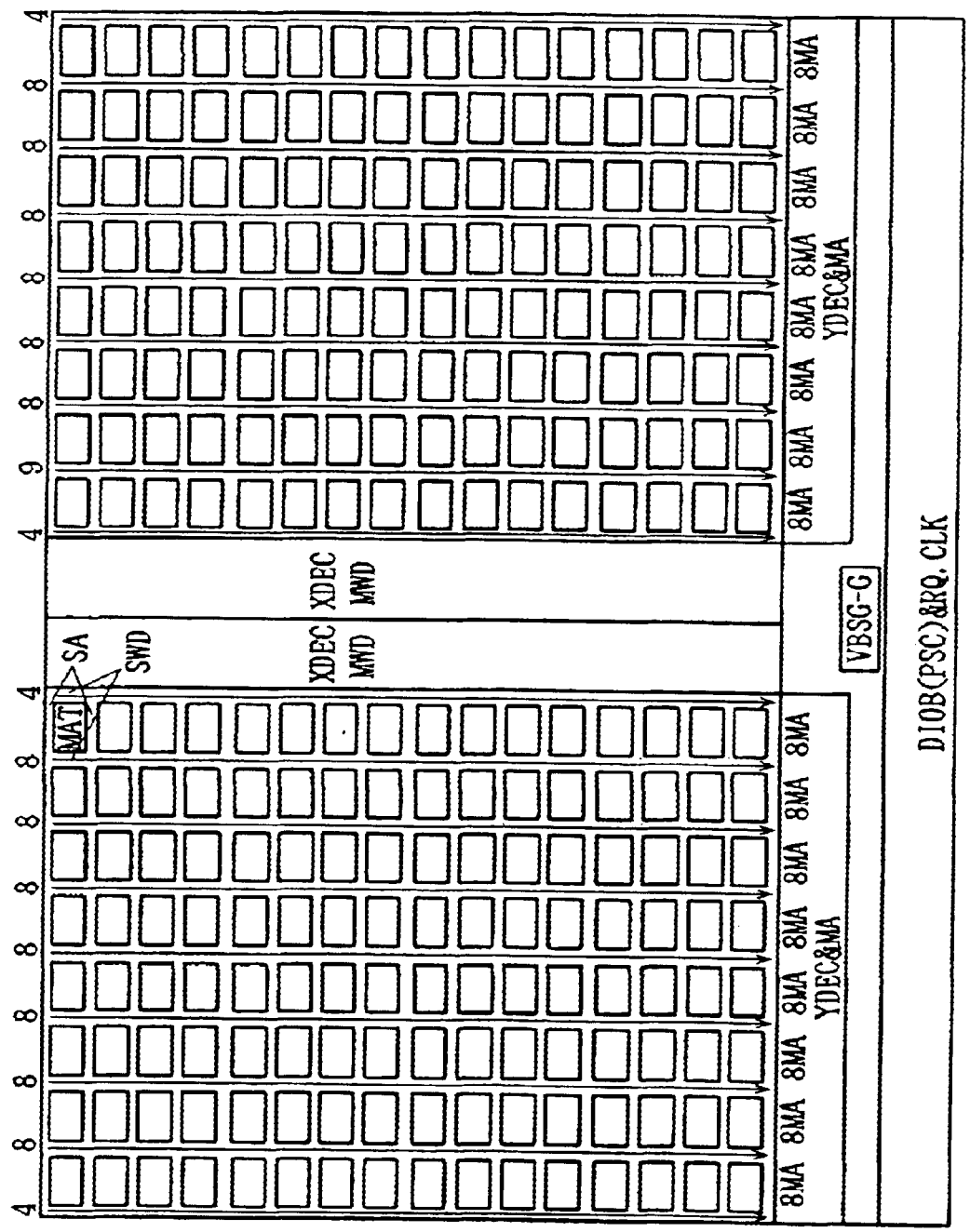
FIG. 23 is a schematic layout diagram of another dynamic RAM embodying the invention.

FIG. 23 is a schematic layout view of another dynamic RAM embodying the invention. In FIG. 23, circuit blocks are shown approximating the actual geometric layout pattern on a semiconductor chip. The dynamic RAM of this embodiment illustratively has a storage capacity of about 64 megabits. The memory chip in FIG. 23 is formed oblong in the longitudinal direction. The leftmost edge of the memory array is constructed close to the leftmost edge of the semiconductor chip. The top and bottom edges of the memory array are formed along the top and bottom edges of the semiconductor chip. On the right hand side of the memory array are main amplifiers MA, Y decoders YDEC, and I/O circuits DIOB, RQ and CLK.

The memory array is divided illustratively into two portions by a horizontal center line. The upper and lower memory mats thus divided are each furnished with an X decoder and a main word driver MWD located along the horizontal center line. Where the memory array is divided in two and the main word drivers are located in the middle as shown, main word lines are each halved in length so that the speed of a word line selecting operation is boosted.

The memory array are divided as described into two portions, each portion comprising a plurality of memory mats in a row-and-column matrix layout. Illustratively, eight memory mats are furnished in the row direction (i.e., in word line direction) and 16 memory mats are provided in the column direction (i.e., in bit line direction). It follows that the total number of memory mats (MAT) is 256 (=8×16×2). One memory mat has a storage capacity of about 25 kilobits (=512×512), so that the total capacity of the memory array is as large as 64 megabits as mentioned.

Each memory mat MAT is equipped with a sub word driver SWD and a latch type sense amplifier SA. The sub word driver SWD is used to select a word line (sub word line) to which a dynamic memory cell is connected. The sense amplifier SA amplifies a stored data signal read out onto the bit line to which the dynamic memory cell is connected, so as to generate a rewrite signal to the storage capacitor of the dynamic memory cell in question. The sense amplifier SA is furnished with a local I/O line LIO and a column switch for connecting the selected bit line to the local I/L line LIO.

Main I/O lines are arranged along the sense amplifiers between the memory mats, i.e., in the column direction. Bit counts of the main I/O lines are indicated by numbers shown along the leftmost edge of the semiconductor chip in FIG. 23. For example, in the lower memory array portion, the upper part of the top left memory mat MAT is provided with four bits of main I/O lines and its lower part with eight bits of main I/O lines, i.e., four bits stemming from the memory mat in question and another four bits from a memory mat one column below. That is, eight main amplifiers (8MA) are located to the right of the memory array in correspondence with the main I/O lines. This allows the memory chip as a whole to input and output data in increments of up to 128 bits (=8×16).

One main word line is selected by the X decoder XDEC and main word driver MWD for eight memory mats arranged in the row direction. One sub word line is selected by the sub word driver SWD for each memory mat. In each memory mat, memory cells are selected in increments of eight bits by the column switch. Selecting the main column switch by use of a mat selection signal allows data to be input and output in increments of 128 bits as mentioned above.

The I/O circuits illustratively include a parallel/serial conversion circuit PSC permitting serial input and output of 128 bits of data in eight passes of 16 bits each. A data storage register for accommodating 128-bit data is provided for use by the parallel/serial conversion circuit PSC. Address and operation mode signals are formed illustratively by combinations of request signals RQ. A clock signal CLK is entered to provide for high-speed data input and output. In synchronism with leading and trailing edges of the clock signal CLK, the request signals RQ and data are input and output. An interface for dealing with such I/O traffic may be constructed illustratively in accordance with Rambus specifications. If dynamic memory cells are used as described, they need to be refreshed at constant intervals. A refresh control circuit for automatically effecting such refresh operations is furnished as part of an X-segment timing generation circuit.

The relations between the memory mats MAT and sub word drivers SWD on the one hand and the latch type sense amplifier on the other hand (for amplifying a stored data signal on the bit line to which the dynamic memory cell is connected so as to generate a rewrite signal to the storage capacitor of the dynamic memory cell in question) are the same as those of the makeups shown in FIGS. 2 and 3 earlier. As in those makeups, a voltage generation circuit VBSG-G is located in the middle of the right-hand side of the chip, the circuit generating a voltage VBSG to be fed to the regions PWELL in which the memory mats are formed.

Figure 24:
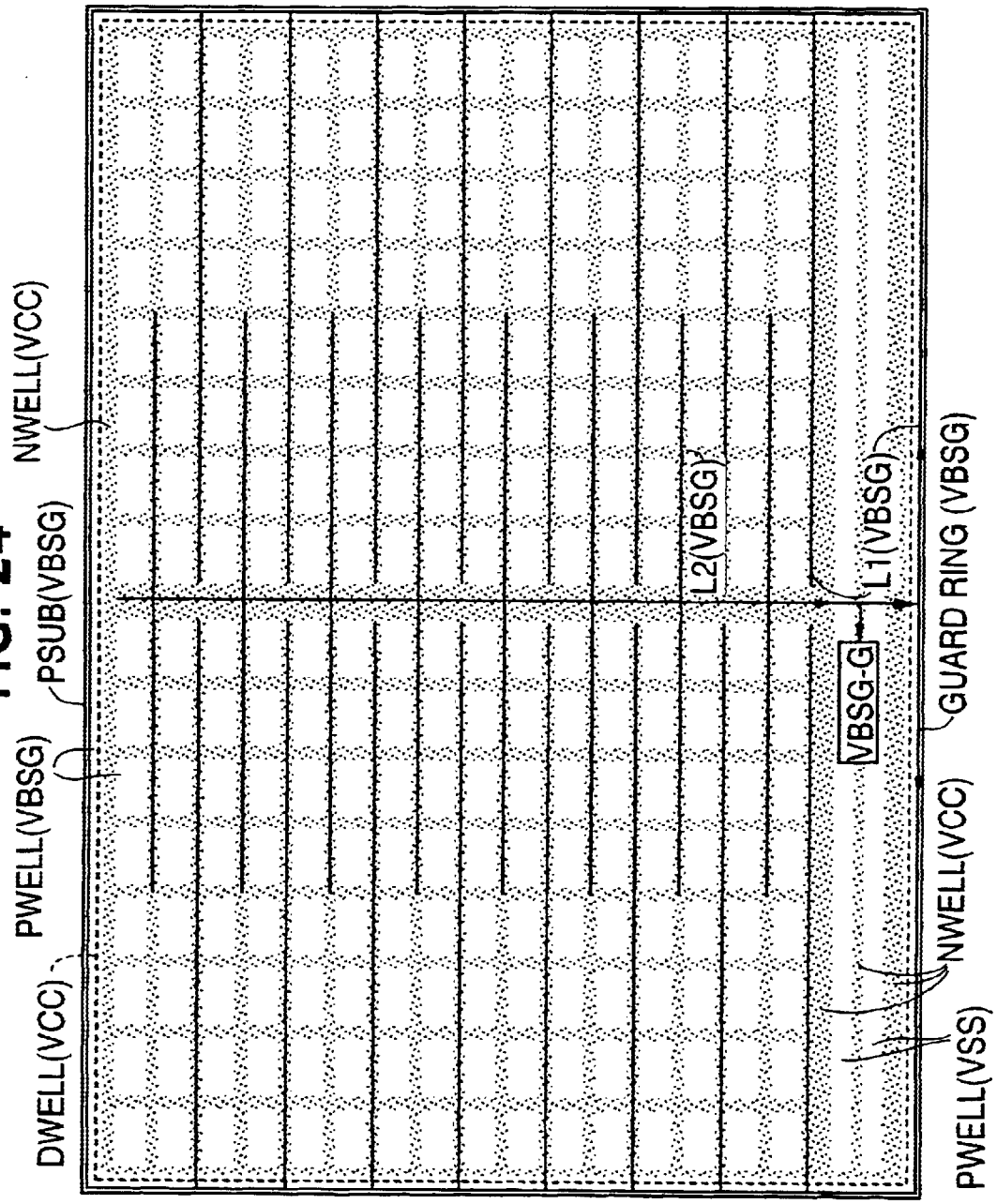
FIG. 24 is a diagram showing connections of a voltage VBSG in the dynamic RAM of FIG. 23.

FIG. 24 is a wiring diagram showing connections of a voltage VBSG in the dynamic RAM of FIG. 23. The setup of FIG. 24 is drawn in a manner geometrically corresponding to that of FIG. 23. Specifically, the voltage generation circuit VBSG-G located in the middle of the right-hand side of the chip divides wiring into a first wiring line L1 and a second wiring line L2. The first wiring line L1 is made up of a first wiring part surrounding the chip periphery and of a second wiring part that branches off in a manner extending from the first wiring part toward the center of the chip. As such, the first wiring line LI supplies the bias voltage VBSG to the regions PWELL of the memory mats.

Figure 25:
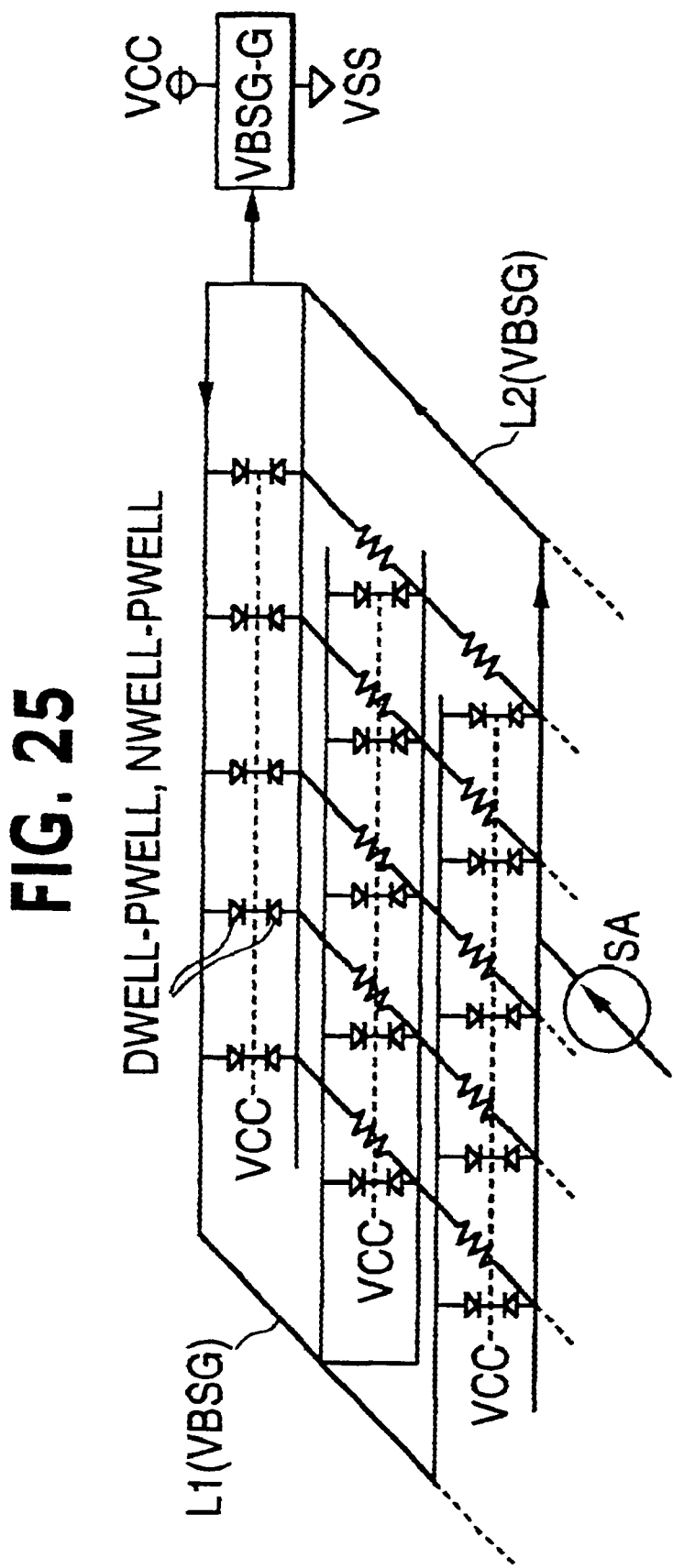
FIG. 25 is an equivalent circuit diagram of the dynamic RAM in FIG. 23.

The second wiring line L2 supplying the operating voltage of sense amplifiers is constituted by a first wiring part extending crosswise in the chip center and by a second wiring part that branches perpendicularly upward and downward off the first wiring part and extending toward the chip exterior. The second wiring part of the first wiring line L1 and that of the second wiring line L2 sandwich the memory mats alternately. In FIG. 24, the second wiring part of the first wiring line Li and that of the second wiring line L2 are shown crosshatched in the regions NWELL as in examples. In an area surrounded by dotted lines, the above-mentioned regions DWELL are formed. FIG. 25 is an equivalent circuit diagram of the dynamic RAM in FIG. 24. As shown in FIG. 25, when the embodiment is divided into the first wiring line L1 and the second wiring line L2 around the voltage generation circuit VBSG, currents triggered by operation of the sense amplifier SA connected to the second wiring line flow into the voltage generation circuit VBSG through the second wiring line. Such currents are absorbed by the voltage generation circuit VBSG. The noise generated at that point is prone to be propagated over the first wiring line L1 to the regions PWELL wherein the memory mats are formed. However, the propagation of the noise is inhibited by wiring resistance and by the filtering effect of parasitic diodes (parasitic capacity) between the regions DWELL and PWELL as well as between the regions NWELL and PWELL, whereby the memory cells are stabilized in operation.

Figures 26A, 26B:
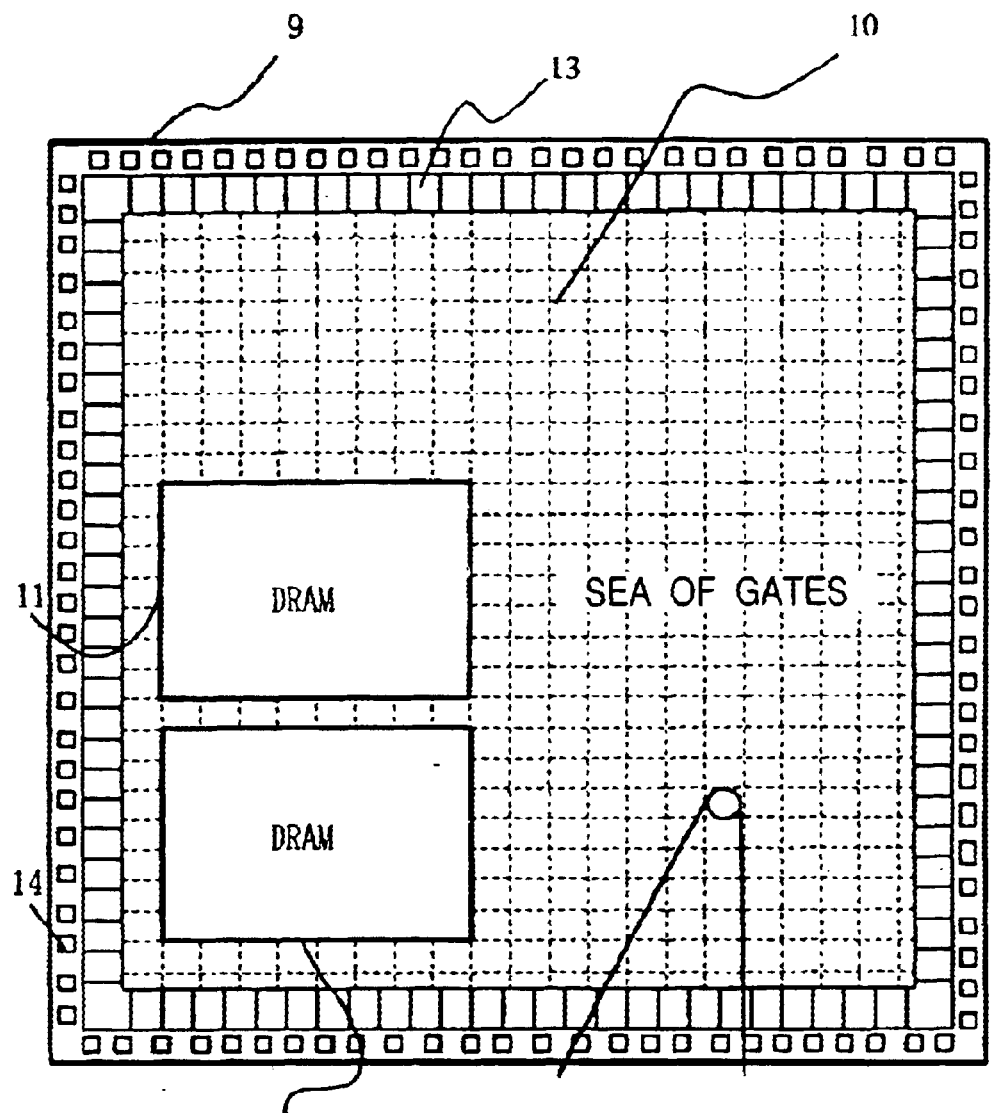
FIG. 26 is a diagram of a semiconductor integrated circuit device embodying the invention.

FIG. 26 is a block diagram of a semiconductor integrated circuit device embodying the invention. In FIG. 26, circuit blocks are shown approximating the actual geometric layout pattern on a semiconductor substrate. The semiconductor integrated circuit device of FIG. 26 comprises a semiconductor chip 9, internal circuits 10, on-chip RAMs 11 and 12, and logic circuits making up the rest. The on-chip RAMs 11 and 12 are illustratively constituted by dynamic RAMs of the above-described types. In the area in which the internal circuits 10 are formed, the regions except for the RAM blocks constitute a sea of gates. These regions are packed with MOSFETs as shown in an enlarged pattern 15 in the view, forming a master slice layout that has wiring installed so as to implement desired circuit functions. The periphery of the semiconductor chip 9 are furnished with bonding pads 14. Input/output circuits 13 are provided between the bonding pads 14 on the one hand and the internal circuits 10 on the other hand.

In the example of FIG. 26, the address selection MOSFET making up each memory cell uses a low threshold voltage such as that of ordinary CMOS circuits as described above. This makes it possible to construct a semiconductor integrated circuit device incorporating dynamic RAMs through the use of manufacturing processes for CMOS circuits such as gate arrays. In other words, a DRAM-mixed logic semiconductor integrated circuit device is fabricated without resorting to complicated manufacturing processes.

The major effects and benefits available from the above-described embodiments are as follows:

(1) A positive bias voltage higher than the ground potential of the circuit and lower than the PN forward voltage is generated and supplied as a bias voltage to P-type well regions in which address selection MOSFETs of dynamic memory cells are formed. This drastically reduces any PN junction leakage current that may occur between the substrate (P-type well regions) on the one hand and the source and drain diffusion layers of the address selection MOSFETs connected to the storage nodes of capacitors on the other hand. As a result, the data retention time of the memory cells is prolonged and the boosted voltage level of word lines is lowered, whereby an allowable field intensity is ensured for the gate insulating films of the MOSFETs.

(2) Pairs of bit lines are each arranged in parallel. A signal read out of a memory cell connected to one of a given pair of bit lines is amplified by a sense amplifier using the precharging voltage of the other bit line as a reference voltage. At the same time, the sense amplifier utilizes the positive bias voltage as the Low level operating voltage. Thus with the threshold voltage of the address selection MOSFETs held as low as that of ordinary MOSFETs, feeding the word line with the Low level such as the circuit ground potential at data retention time causes the source and gate to be reversely biased so as to increase the effective threshold voltage. This minimizes the sub threshold leakage current flowing between the source and the drain. When combined with the reduction in the PN junction leakage current of the feature (1) above, the lowered sub threshold leakage current prolongs data retention times.

(3) Each sense amplifier is composed of a CMOS latch circuit and a power switching circuit. The CMOS latch circuit comprises two CMOS inverter circuits each made of a P- and an N-channel MOSFET, the input and output terminals of the CMOS inverter circuits being cross-connected. The power switching circuit includes P- and N-channel MOSFETs supplying the operating voltage and circuit ground potential to the CMOS latch circuits. The N-channel MOSFETs feeding the operating voltage comprise a first and a second MOSFET. The first MOSFET provides the bias voltage, and the second MOSFET furnishes the circuit ground potential when turned on only for a predetermined period of time at the start of sense operation. These components alleviate loads of the positive bias voltage VBSG while boosting the speed of sense amplifier operation.

(4) The P-type well regions where the memory cells are formed additionally include the formation of N-channel MOSFETs constituting the sense amplifiers. This enhances the degree of circuit integration.

(5) The address selection MOSFETs are formed by the same manufacturing processes as those for N-channel MOSFETs making up the peripheral circuits. This reduces the threshold voltage for the address selection MOSFETs while simplifying their manufacturing processes. These benefits combine to have DRAM-mixed logic circuits fabricated more easily than before.

(6) The P-type well regions accommodate memory cell arrays including dynamic memory cells in matrix layout, sense amplifiers, precharging circuits for precharging the pair bit lines, and N-channel MOSFETs constituting the column switches for selecting the pair bit lines. Deep N-type wells are commonly formed under the P-type well regions so that the latter are fed with the bias voltage while being electrically isolated from the other circuit elements. This permits higher degrees of circuit integration than before and allows the peripheral circuits to be assigned bias settings corresponding to their respective circuit functions.

(7) The P-type well regions that contain the N-channel address selection MOSFETs making up the dynamic memory cells are electrically isolated from other P-type well regions wherein the N-channel MOSFETs constituting the sense amplifiers are formed. The other P-type well regions are supplied with the circuit ground potential. This setup increases the conductance of the N-channel MOSFETS, thus boosting the speed of sense amplifier operation.

(8) The deep N-type well regions are fed with the highest of operating voltages available in the semiconductor integrated circuit device. The P-type semiconductor substrate comprising the deep N-type well regions is supplied with the circuit ground potential. This prevents a latch-up and ensures stable operation.

(9) In the peripheral circuits, the word driver generating at least a selection signal for selecting a word line to which a memory cell is connected generates two levels: the selected level made higher than the High level of the bit lines by the equivalent of the threshold voltage for the address selection MOSFETs, and the nonselected level corresponding to the circuit ground potential. The arrangement permits a full-write operation on a given memory cell and, with data held in the memory cell, reduces the sub threshold leakage current between the drain and the source by applying a reverse bias between the gate and the source.

(10) The deep N-type well regions are fed with the supply voltage of the semiconductor integrated circuit device, and the selected level of the word line is generated by a bootstrap circuit. This permits full-write operations on the memory cells and allows the parasitic capacity between the substrate and the components to be used as a stabilizing capacity for the bias voltage.

(11) The deep N-type well regions are supplied with a boosted voltage corresponding to the selected level of the word line, and the word driver for driving the word line is made of CMOS circuits operating on that boosted voltage. This setup prevents a latch-up, simplifies the word driver structure and boosts the speed of word line selecting operation.

(12) The word lines are made up of main word lines and a plurality of sub word lines assigned commonly to each of the main word lines. The sub word lines are connected to the gates of the address selection MOSFETs of dynamic memory cells. One of the plurality of sub word lines is selected by a sub word driver receiving a main word line signal and a sub word selection line signal. This makeup provides for an increased storage capacity.

(13) The P-type well regions isolated by the deep N-type well regions as well as by the N-type well regions surrounding the deep N-type well regions serve as bases, the N-type well regions as collectors, and the N-type diffusion layers formed in the P-type well regions as emitters of bipolar transistors. The base and collector of each of these transistors are commonly connected to provide a bias current while the emitter of the transistor in question is connected to the circuit ground potential. The bias voltage is generated by use of the voltage between the base and the emitter as the reference voltage. This is a simplified structure that generates the bias voltage in a stable fashion.

(14) The first wiring line extending from a voltage generation circuit and tapped by the sense amplifiers for power supply, and the second wiring line extending from the voltage generation circuit and supplying the bias voltage to the P-well regions, are branched in such a manner that any noise propagated from the sense amplifier side to the P-well regions is minimized.

(15) The first wiring line is made up of a first wiring part surrounding the chip periphery and of a second wiring part that branches off in a manner extending from the first wiring part toward the interior of the chip. The second wiring line is constituted by a first wiring part extending across a middle portion of the chip and by a second wiring part that branches perpendicularly off the first wiring part and extends toward the chip periphery. This setup, by making use of the wiring resistance and parasitic capacity involved, minimizes any noise propagated from the sense amplifiers in operation to the P-type well regions.

(16) The threshold voltage of the address selection MOSFETs in the dynamic RAM is made as low as that of ordinary MOSFETs, and a positive bias voltage which is higher than the circuit ground potential and lower than the PN forward voltage is generated and supplied to the P-type well regions in which the address selection MOSFETs are formed. This arrangement makes it possible to fabricate in a simplified fashion a semiconductor integrated circuit device comprising dynamic RAMs of the above type and logic control circuits allowing the RAMs to input and output data, wherein data retention times are prolonged and an allowable field intensity is ensured.

Although the description above contains many specificities, these should not be construed as limiting the scope of the invention but as merely providing illustrations of some of the presently preferred embodiments of this invention. It is to be understood that changes and variations may be made without departing from the spirit or scope of the claims that follow. For example, the memory array layout may take any one of a variety of forms and is not limited to the split word line system or hierarchical word line system made of main word lines and sub word lines as described above. The circuit for generating the bias voltage VBSG may be any circuit that generates a reference voltage of about +0.5 V based on the threshold voltage of the MOSFETs.

The present invention applies extensively to semiconductor integrated circuit devices incorporating dynamic memory cells, such as general-purpose dynamic rams, image-use dynamic rams having serial I/O and random I/O functions, synchronous dynamic rams, and semiconductor integrated circuit devices comprising such dynamic rams.

What is claimed is:

1. A semiconductor integrated circuit device comprising:
   dynamic memory cells made of N-channel address selection MOSFETs each having a gate, a source and a drain, said gate being connected to a word line, either of said source and said drain being connected to bit lines intersecting said word line, the other of said source and said drain being connected to a storage node of a data storage capacitor;
   a peripheral circuit which performs select, write and read operations on any of said dynamic memory cells;
   a P-type well region in which said address selection MOSFETs are formed; and
   an internal power supply circuit which supplies said P-type well region with a positive bias voltage higher than a circuit ground potential.

2. A semiconductor integrated circuit device according to claim 1, wherein said bit lines are constituted by a pair of bit lines arranged in parallel, said semiconductor integrated circuit device further comprising a sense amplifier for amplifying a signal read out of a memory cell connected to one of a given pair of bit lines through the use of a precharging voltage on the other bit line as a reference voltage, and
   wherein said sense amplifier is fed with a positive bias voltage as a Low level operating voltage.

3. A semiconductor integrated circuit device according to claim 2, wherein said sense amplifier is constituted by a CMOS latch circuit and a power switching circuit, said CMOS latch circuit comprising two CMOS inverter circuits each made of a P- and an N-channel MOSFET, said CMOS inverter circuits having input and output terminals thereof being cross-connected, said power switching circuit including P- and N-channel MOSFETs for supplying an operating voltage and said circuit ground potential to said CMOS latch circuits; and
   wherein said N-channel MOSFETs feeding said operating voltage comprise a first and a second MOSFET, said first MOSFET providing said bias voltage, said second MOSFET furnishing said circuit ground potential when turned on only for a predetermined period of time upon start of sense operation.

4. A semiconductor integrated circuit device according to claim 3, wherein said N-channel MOSFETs constituting said sense amplifier are also formed in said P-type well region.

5. A semiconductor integrated circuit device according to claim 1, wherein said address selection MOSFETs are fabricated by the same manufacturing processes as N-channel MOSFETS constituting said peripheral circuits.

6. A semiconductor integrated circuit device according to claim 1, wherein said P-type well region has a memory cell array including dynamic memory cells in matrix layout, a sense amplifier, a precharging circuit for precharging said bit lines, and N-channel MOSFETs constituting column switch for selecting any of said bit lines; and
   wherein a deep N-type well is commonly formed under said P-type well region so that said P-type well region is fed with said bias voltage while being electrically isolated from the other circuit elements.

7. A semiconductor integrated circuit device according to claim 1, wherein said P-type well region accommodating only said N-channel address selection MOSFETs which make making up said dynamic memory cells are electrically isolated from other P-type well regions wherein N-channel MOSFETs constituting sense amplifiers are formed, the other P-type well region being supplied with said circuit ground potential.

8. A semiconductor integrated circuit device according to claim 6, wherein said deep N-type well region is fed with the highest of operating voltages available in said semiconductor integrated circuit device having a P-type semiconductor substrate; and
   wherein said P-type semiconductor substrate comprising said deep N-type well regions is supplied with said circuit ground potential.

9. A semiconductor integrated circuit device according to claim 6, wherein said peripheral circuit includes a word driver for generating at least a selection signal for selecting a word line to which a memory cell is connected, said word driver generating a selected and a nonselected level, said selected level being higher than a High level written to said bit lines, and said nonselected level corresponding to said circuit ground potential.

10. A semiconductor integrated circuit device according to claim 9, wherein said deep N-type well region is fed with a supply voltage of said semiconductor integrated circuit device and said selected level of said word line is generated by a bootstrap circuit.

11. A semiconductor integrated circuit device according to claim 9, wherein said deep N-type well region is supplied with a boosted voltage corresponding to said selected level of said word line, and said word driver for driving said word line is made of CMOS circuits operating on said boosted voltage.

12. A semiconductor integrated circuit device according to claim 1, wherein said word lines are made up of main word lines and a plurality of sub word lines assigned commonly to each of said main word lines;
   wherein said sub word lines are connected to gates of said address selection MOSFETs of said dynamic memory cells; and
   wherein one of said plurality of subword lines is selected by a sub word driver receiving a main word line signal and a sub word selection line signal.

13. A semiconductor integrated circuit device according to claim 1, wherein said P-type well region isolated by a deep N-type well region as well as by a N-type well region surrounding said deep N-type well region serve as bases, said N-type well region as collectors, and N-type diffusion layer formed in said P-type well region as emitters of bipolar transistors; and
   wherein a base and a collector of each of said bipolar transistors are commonly connected to provide a bias current while an emitter of the transistor in question is connected to said circuit ground potential, so that a bias voltage is output by a voltage generation circuit using a voltage between said base and said emitter as a reference voltage.

14. A semiconductor integrated circuit device according to claim 13, wherein said voltage generation circuit has a first and a second wiring line furnished in a branching fashion, said first wiring line extending from said voltage generation circuit and tapped by sense amplifiers for power supply, said second wiring line extending from said voltage generation circuit and supplying said bias voltage to said P-well region.

15. A semiconductor integrated circuit device according to claim 14, wherein said first wiring line is made up of a first wiring part surrounding a semiconductor chip periphery and of a second wiring part that branches off in a manner extending from said first wiring part toward an interior of the chip; and wherein said second wiring line is constituted by a first wiring part extending across a middle portion of said chip and by a second wiring part that branches perpendicularly off said first wiring part and extends toward the chip periphery.

16. A semiconductor integrated circuit device having a memory portion including a dynamic RAM comprising:

dynamic memory cells made of N-channel address selection MOSFETs each having a gate, a source and a drain, said gate being connected to a word line, either of said source and said drain being connected to bit lines intersecting said word line, the other of said source and said drain being connected to a storage node of a data storage capacitor;

a peripheral circuit which performs select, write and read operations on any of said dynamic memory cells;

a P-type well region in which said address selection MOSFETs are formed; and an internal power supply circuit which supplies said P-type well region with a positive bias voltage higher than a circuit ground potential;

said semiconductor integrated circuit device further comprising a logic control circuit portion for inputting and outputting data at least to and from said memory portion.

17. A semiconductor integrated circuit device according to claim 16, wherein MOSFETs including said address selection MOSFETs of said memory portion are fabricated by the same manufacturing processes as MOSFETs of said logic control circuit portion.

18. A semiconductor integrated circuit device according to claim 16, wherein said bit lines are constituted by a pair of bit lines arranged in parallel, said semiconductor integrated circuit device further comprising a sense amplifier for amplifying a signal read out of a memory cell connected to one of a given pair of bit lines through the use of a precharging voltage on the other bit line as a reference voltage; and wherein said sense amplifier is fed with a positive bias voltage as a Low level operating voltage.

19. A semiconductor integrated circuit device according to claim 18, wherein said sense amplifier is constituted by a CMOS latch circuit and a power switching circuit, said CMOS latch circuit comprising two CMOS inverter circuits each made of a P- and an N-channel MOSFET, said CMOS inverter circuits having input and output terminals thereof being cross-connected, said power switching circuit including P- and N-channel MOSFETs for supplying an operating voltage and said circuit ground potential to said CMOS latch circuits; and wherein said N-channel MOSFETs feeding said operating voltage comprise a first and a second MOSFET, said first MOSFET providing said bias voltage, said second MOSFET furnishing said circuit ground potential when turned on only for a predetermined period of time upon start of sense operation.

20. A semiconductor integrated circuit device according to claim 19, wherein said N-channel MOSFETs constituting said sense amplifier is also formed in said P-type well region.

21. A semiconductor integrated circuit device according to claim 20, wherein said address selection MOSFETs are fabricated by the same manufacturing processes as N-channel MOSFETs constituting said peripheral circuits and MOSFETs of said logic control circuit portion.

22. A semiconductor integrated circuit device having a semiconductor substrate and operating when supplied with a positive supply voltage and a circuit ground potential, said semiconductor integrated circuit device comprising:

word lines;

pairs of bit lines;

data storage capacitors;

N-channel MOSFETs each having a gate connected to any one of said word lines and a source-drain path interposed between one of the paired bit lines on the one hand and a terminal of any one of said data storage capacitors on the other hand; and a circuit for generating a positive internal voltage which is higher than said circuit ground potential;

wherein source and drain regions constituting said N-channel MOSFETs are formed in P-type region of said semiconductor substrate; and wherein said positive internal voltage is supplied to said P-type region.

23. A semiconductor integrated circuit device according to claim 22, further comprising sense amplifiers for amplifying voltages on any one of said pairs of bit lines so that one of the paired bit lines will carry a High level voltage and the other bit line will carry a Low level voltage;

wherein said Low level voltage corresponds to said positive internal voltage.

24. A semiconductor integrated circuit device according to claim 23, wherein a nonselected level of any one of said word lines corresponds to the level of said circuit ground potential.

25. A semiconductor integrated circuit device according to claim 24, wherein the High level voltage amplified by said sense amplifiers corresponds to said positive supply voltage.

26. A semiconductor integrated circuit device according to claim 25, wherein a selected level of any one of said word lines corresponds to a voltage level higher than said positive supply voltage.

27. A semiconductor integrated circuit device according to claim 26, wherein said circuit for generating said positive internal voltage operates when supplied with said positive supply voltage and said circuit ground potential.

* * * * *